United States Patent
Kono et al.

(10) Patent No.: US 7,154,802 B2
(45) Date of Patent: Dec. 26, 2006

(54) SEMICONDUCTOR MEMORY DEVICE CAPABLE OF OPERATING AT HIGH SPEED AND WITH LOW POWER CONSUMPTION WHILE ENSURING RELIABILITY OF MEMORY CELL

(75) Inventors: Takashi Kono, Hyogo (JP); Hironori Iga, Hyogo (JP)

(73) Assignee: Renesas Technology Corp., Tokyo (JP)

( * ) Notice: Subject to any disclaimer, the term of this patent is extended or adjusted under 35 U.S.C. 154(b) by 0 days.

(21) Appl. No.: 11/493,663

(22) Filed: Jul. 27, 2006

(65) Prior Publication Data

US 2006/0262629 A1  Nov. 23, 2006

Related U.S. Application Data

(62) Division of application No. 11/030,185, filed on Jan. 7, 2005, now Pat. No. 7,102,953.

(30) Foreign Application Priority Data

Feb. 3, 2004 (JP) ............................. 2004-026998

(51) Int. Cl.
G11C 5/14 (2006.01)
(52) U.S. Cl. ...................... 365/226; 365/227
(58) Field of Classification Search ............ 365/226, 365/227, 201, 189.07, 189.09
See application file for complete search history.

(56) References Cited

U.S. PATENT DOCUMENTS

| | | | |
|---|---|---|---|
| 5,553,021 A * | 9/1996 | Kubono et al. | 365/185.33 |
| 6,038,189 A | 3/2000 | Morishita | |
| 6,128,242 A * | 10/2000 | Banba et al. | 365/226 |
| 6,232,824 B1 | 5/2001 | Kono | |
| 6,314,028 B1 | 11/2001 | Kono | |
| 6,353,355 B1 | 3/2002 | Kato | |
| 6,434,078 B1 | 8/2002 | Morishita | |
| 6,605,986 B1 * | 8/2003 | Tanzawa et al. | 327/536 |
| 2003/0007296 A1 | 1/2003 | Tomishima et al. | |

FOREIGN PATENT DOCUMENTS

| | | |
|---|---|---|
| JP | 08-147998 | 6/1996 |
| JP | 2001-216779 | 8/2001 |
| JP | 2003-022697 | 1/2003 |

* cited by examiner

Primary Examiner—Anh Phung
(74) Attorney, Agent, or Firm—Buchanan Ingersoll & Rooney PC

(57) ABSTRACT

A monitor circuit for monitoring external potential EXTVDD and variable delay circuit determine the time interval in which signal ZODACT is being at the L level according to the potential level of external potential EXTVDD, and thus the supplying time of external potential EXTVDD can be dynamically changed. When external potential EXTVDD is at the upper limit of specification of product, the supplying time is short, thereby preventing overcharge of memory cells or bit lines. When external potential EXTVDD is at the lower limit of specification of product, the supplying time becomes longer, thereby ensuring a sufficient over-driving time interval. It is possible to ensure the reliability of the memory cells and perform the reading operation throughout the entire range of the specification of product of external potential EXTVDD. Therefore, it is possible to provide a semiconductor memory device capable of performing a reading operation at high speeds while ensuring the reliability.

3 Claims, 20 Drawing Sheets

|  | OUT<0> | OUT<1> | OUT<2> |
|---|---|---|---|
| VD0≦VDDSST | L | L | L |
| VD1≦VDDSST<VD0 | H | L | L |
| VD2≦VDDSST<VD1 | H | H | L |
| VDDSST<VD2 | H | H | H |

SEMICONDUCTOR MEMORY DEVICE CAPABLE OF OPERATING AT HIGH SPEED AND WITH LOW POWER CONSUMPTION WHILE ENSURING RELIABILITY OF MEMORY CELL

CROSS REFERENCE TO RELATED APPLICATIONS

This application is a divisional application of application Ser. No. 11/030,185, filed Jan. 7, 2005, now U.S. Pat. No. 7,102,953, issued on Sep. 5, 2006.

BACKGROUND OF THE INVENTION

1. Field of the Invention

The present invention relates to a semiconductor memory device and, more particularly, to a semiconductor memory device including a power supply circuit.

2. Description of the Background Art

In recent years, in order to realize cost reduction lower electric power consumption and higher speeds, miniaturization of transistors utilized in semiconductor memory devices has been progressed. In order to ensure the reliability of miniaturized transistors, it is necessary to lower the power supply potential which is fed from outside.

Semiconductor memory devices are generally equipped with an internal power supply circuit. For example, in the case of a DRAM, the internal power supply circuit serves to reduce a high power supply potential supplied from the outside to a lower potential, in order to supply a potential which is harmless to miniaturized transistors and capacitors in memory cells.

However, if the power supply potential supplied from the outside is reduced, this produces a problem that a sufficient driving potential for operations can not be supplied. Particularly, when the voltage generated between the gate and source of a MOS transistor constituting a sense amplifier in the memory array is not sufficiently higher than the threshold voltage of the MOS transistor, the driving capability of the MOS transistor is degraded, thereby increasing the time for amplifying micro-signals generated on bit line pairs.

A method for overcoming this problem is a sense amplifier driving method which is generally called a "over-drive sensing method".

Conventionally, the power supply for the high-side potential of sense amplifiers for detecting and amplifying small potential differences read into bit line pairs has been a potential from the internal power supply circuit, namely a potential generated by reducing the power supply potential supplied from the outside. On the contrary, with the "over-drive sensing method", the high-potential side power supply line of the sense amplifier is supplied with a power supply potential from the outside, instead of a reduced potential from the internal power supply circuit, for a constant time interval just before and after the activation of the sense amplifiers, thereby increasing the operation power supply for the sense amplifiers and enabling the sense amplifiers to amplify micro-signals at high speeds.

As a concrete example of the over-driving sensing method, for example, Japanese Laid-Open Patent Publication No. 2001-216779 discloses an internal power supply potential generating circuit and the control method thereof for semiconductor devices. The internal power supply potential generating circuit includes an over-drive driving circuit and two types of step-down regulators having different output potentials. Further, in the reading operation, the over-drive driving circuit is operated at first and then the first step-down regulator is operated, and on standby the second step-down regulator which outputs a lower potential than that of the first step-down regulator is operated, in order to reduce the current consumption.

Conventional over-drive sensing methods supply an external power supply potential to the sense amplifiers for a constant time interval, regardless of the amplitude of the external power supply potential. With this configuration, even if the external power supply potential is equal to or higher than the maximum value of specification of product or equal to or lower than the minimum value of specification of product, the external power supply potential is supplied to the sense amplifiers for a constant time interval. Therefore, if the external power supply potential approaches or exceeds the maximum value of specification of product, excessive voltages are applied to memory cells through the sense amplifiers.

On the other hand, if the external power supply potential approaches or decreases below the minimum value of specification of product, there has been generated a problem that the effect of high-speed operations of the sense amplifiers with over-drive method can not be obtained.

SUMMARY OF THE INVENTION

It is an object of the present invention to provide a semiconductor memory device capable of performing a reading operation at high speeds while ensuring the reliability.

The present invention is, in summary, a semiconductor memory device including: a plurality of memory cells arranged in rows and columns; a plurality of bit line pairs arranged in correspondence with the columns; a plurality of sense amplifiers provided in correspondence with the plurality of bit line pairs for amplifying potential differences on corresponding the bit line pairs; and a power supply circuit supplying a first power supply potential and a second power supply potential to the sense amplifiers. The power supply circuit includes a first power supply circuit supplying the first power supply potential, and a second power supply circuit detecting the second power supply potential which is input, determining the supplying time according to the potential and supplying the second power supply potential. The semiconductor memory device further includes a control circuit, instructing the second power supply circuit to detect the second power supply potential, in response to the inactivation of a row signal indicating the activation time of rows of the plurality of memory cells.

According to another aspect of the present invention, the present invention is a semiconductor memory device including a load circuit and a power supply circuit supplying a power supply potential to the load circuit. The power supply circuit includes a first driving circuit determining whether or not the power supply potential is a predetermined potential and adjusting the power supply potential to the predetermined potential, a second driving circuit activated according to the result of the determination of the first driving circuit, determining whether or not the power supply potential is a predetermined potential and adjusting the power supply potential to the predetermined potential, and an equalizing portion equalizing the result of the determination of the first driving circuit and the result of the determination of the second driving circuit when the second driving circuit completes the operation.

Therefore, a main advantage of the present invention is that it becomes possible to perform reading operations at high speeds while ensuring the reliability. Another advantage is that the current consumption can be reduced.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

First Embodiment

Figure 1:
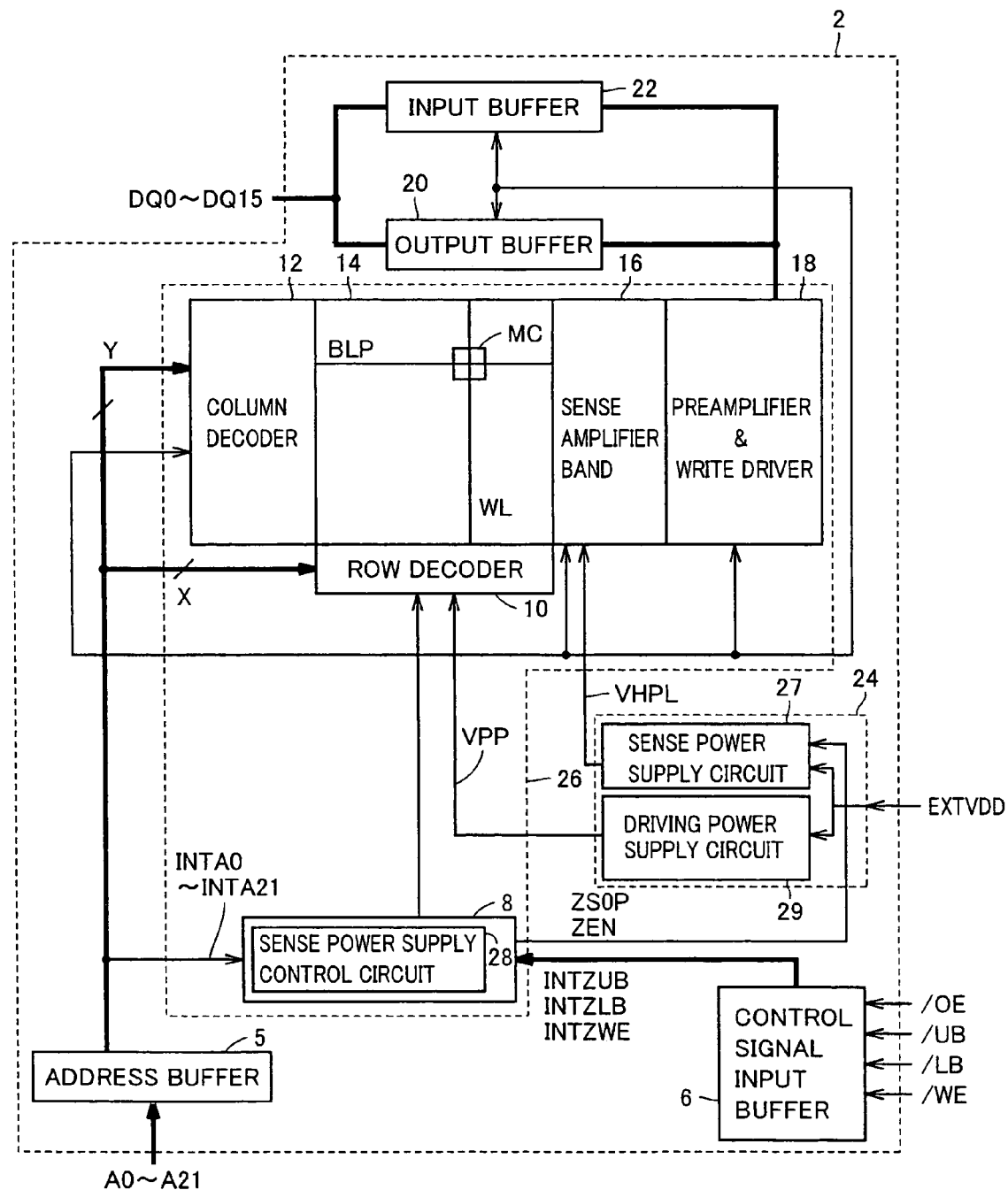
FIG. 1 is a schematic block diagram illustrating an exemplary structure of the semiconductor memory device according to the present invention.

FIG. 1 is a schematic block diagram illustrating an exemplary construction of a semiconductor memory device according to the present invention. Further, in the present invention, there will be represented a pseudo static random access memory as an example of the semiconductor memory device. However, the present invention is applicable to other semiconductor memory devices which perform a sensing operation, as well as to a pseudo static random access memory.

Referring to FIG. 1, a semiconductor memory device 2 includes a memory cell array 14 including a plurality of memory cells arranged in a matrix shape, an address buffer 5 which, on receiving address signals A0 to A21, outputs internal addresses INTA0 to INTA21 for generating internal row addresses X, internal column addresses Y and internal synchronization signals, and a control signal input buffer 6 which, on receiving control signals /OE, /UB, /LB and /WE, generates internal control signals INTZUB, INTZLB and INTZWE.

Memory cell array 14 includes memory cells MC arranged in a matrix shape, a plurality of word lines WL provided in correspondence with the rows of memory cells MC and bit line pairs BLP provided in correspondence with the columns of memory cells MC. In FIG. 1, there are representatively illustrated a single memory cell MC, a single word line WL and a single bit line pair BLP.

Semiconductor memory device 2 further includes a control circuit 8 for outputting control signals to the respective blocks, on receiving internal addresses INTA0 to INTA21 from address buffer 5 and on receiving internal control signals INTZUB, INTZLB and INTZLB and INTZWE from control signal input buffer 6.

Control circuit 8 includes a sense power supply control circuit 28 which, on receiving internal addresses INTA0 to INTA21, commands the start of the over-drive sensing operation. Sense power supply control circuit 28 will be described in detail later.

Semiconductor memory device 2 further includes a row decoder 10 for decoding row address signals X provided from address buffer 5. Row decoder 10 includes a word driver for driving the rows (word lines) in memory cell array 14 which are address-specified to a selected state.

Semiconductor memory device 2 further includes a column decoder 12 for decoding internal column addresses Y provided from address buffer 5 to generate column selection signals, and a sense amplifier band 16 including a plurality of sense amplifiers placed therein for detecting and amplifying data in the memory cells MC connected to the selected rows in memory cell array 14.

Semiconductor memory device 2 further includes an input buffer 22 for generating internal written data on receiving written data from outside, a write driver for amplifying internal written data from input buffer 22 and transferring it to the selected memory cells, a preamplifier for amplifying data read out of the selected memory cells, and an output buffer 20 for applying a buffer process to the data from the preamplifier and outputting it to outside.

In FIG. 1, the preamplifier and the write driver are represented as a single block, namely a block 18.

Semiconductor memory device 2 further includes an internal power supply circuit 24 which receives an external potential EXTVDD provided from outside and supplies a constant potential to a load circuit 26.

Load circuit 26 includes control circuit 8, row decoder 10, column decoder 12, memory cell array 14, sense amplifier band 16 and block 18, which have been previously described.

Internal power supply circuit 24 includes a sense power supply circuit 27 which supplies a power supply potential VHPL to the sense amplifier included in sense amplifier band 16, and a driving power supply circuit 29 for supplying a potential VPP to word lines WL.

While in FIG. 1 driving power supply circuit 29 is shown to supply potential VPP to word lines WL, in the present invention driving power supply circuit 29 may be used to supply the power supply to circuit portions included in load circuit 26, other than word lines WL.

Figure 2:
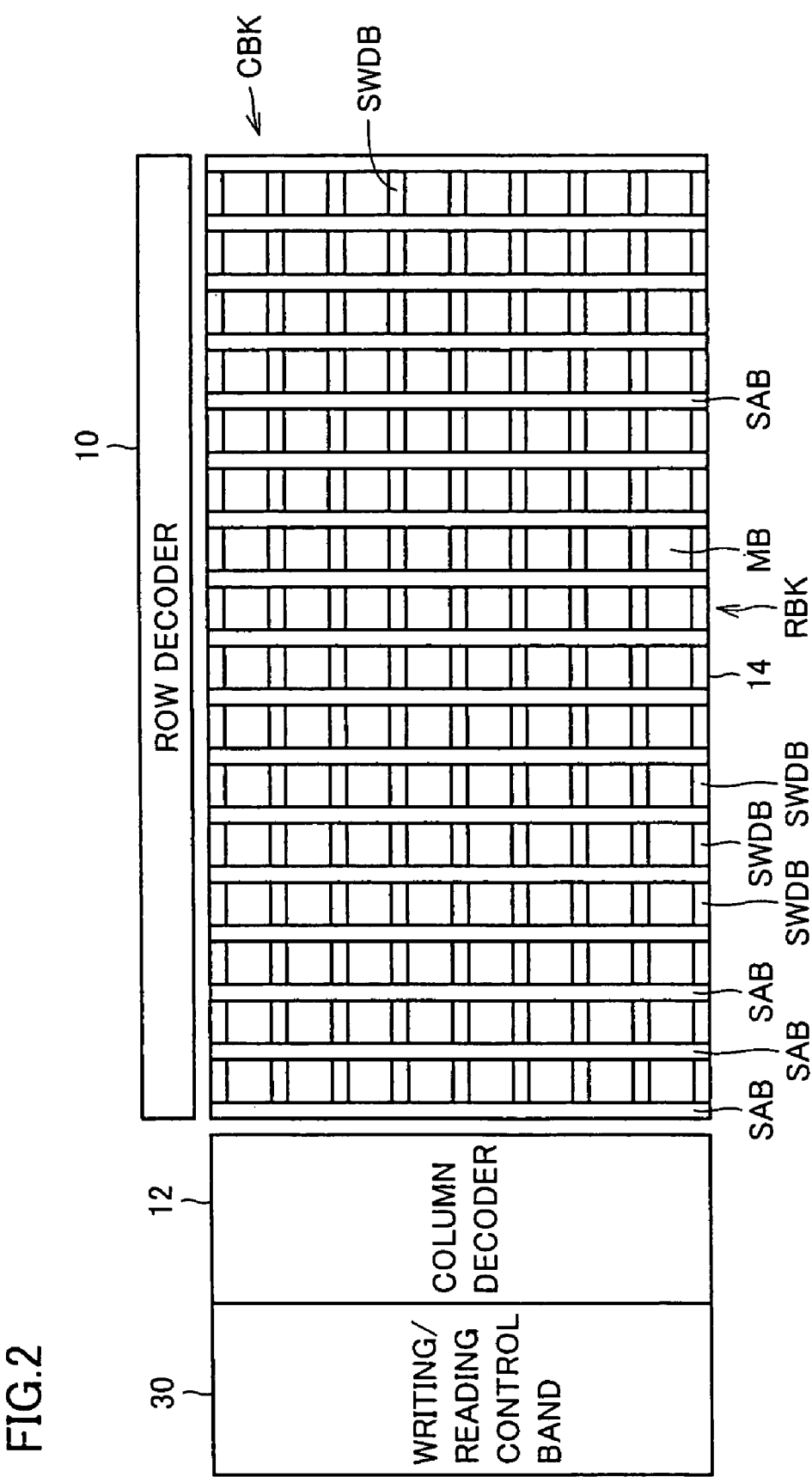
FIG. 2 is a view schematically illustrating the structure of main parts of semiconductor memory device 2 illustrated in FIG. 1.

FIG. 2 is a view illustrating main parts of semiconductor memory device 2 illustrated in FIG. 1.

Referring to FIG. 2, memory cell array 14 is divided into a plurality of memory blocks MB by sense amplifier bands SAB extending in the row direction and sub-word line driver bands SWDB extending in the column direction. Memory blocks MB aligned in the row direction constitute memory row blocks RBK and memory blocks MB aligned in the column direction constitute memory column blocks CBK.

Sense amplifier band SAB includes a sense amplifier circuit shared by the adjacent memory row blocks RBK. Sub-word line driver band SWDB includes a sub-word line driver placed for sub-word lines not shown. Main-word lines are placed such that they are shared by the memory blocks in the row blocks. Main-word lines are driven to the selected state according to row selection signals (main-word line driving signals) from row decoder 10. In the respective memory blocks MB, a plurality of sub-word lines are placed for a single main-word line.

At the external periphery of memory cell array 14, row decoder 10 and column decoder 12 are placed. Further, a writing/reading control band 30 is placed at the external periphery of memory cell array 14. This writing/reading control band 30 includes block 18 illustrated in FIG. 1 and a control circuit for controlling the operations of the write driver and the preamplifier included in block 18.

Figure 3:
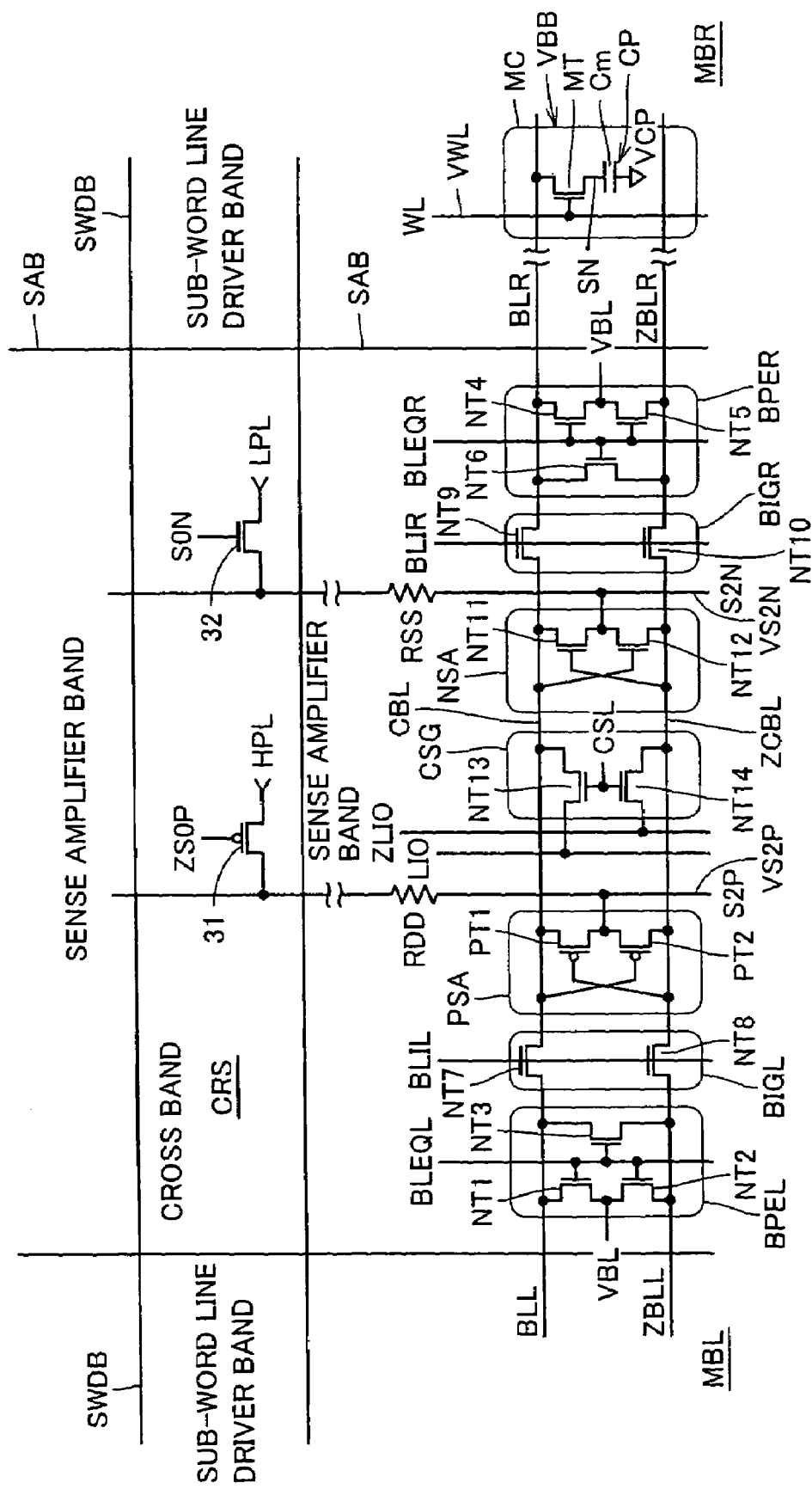
FIG. 3 is a view illustrating the structure of the sense amplifier circuit and the bit line peripheral circuit which are placed in the sense amplifier band.

FIG. 3 is a view illustrating the structure of the sense amplifier circuit and the bit line peripheral circuit placed in the sense amplifier band.

Referring to FIG. 3, there are representatively illustrated the constructions of portions relating to bit lines BLL, ZBLL and BLR, ZBLR included in memory blocks MBL and MBR, respectively.

Bit lines BLL and ZBLL included in memory block MBL are connected to common bit lines CBL and ZCBL through a bit line separation gate BIGL and bit lines BLR and ZBLR included in memory block MBR are connected to common bit lines CBL and ZCBL through a bit line separation gate BIGR. Memory blocks MBL and MBR are memory blocks included in different row block.

The memory cells aligned in a row in the memory block MBL are connected to bit lines BLL and ZBLL and memory cells aligned in a row in the memory block MBR are connected to bit lines BLR and ZBLR. In FIG. 3, there is representatively illustrated a memory cell MC connected to bit lines BLR and ZBLR of memory block MBR.

Memory cell MC includes a memory cell capacitor Cm for storing information, and an access transistor MT for connecting a storage node SN of memory cell capacitor Cm to bit line BLR according to signals on the word line WL.

For common bit lines CBL and ZCBL, there are provided an P sense amplifier PSA consisting of P-channel MOS transistors PT1, PT2 which are cross-connected to each other and an N sense amplifier NSA consisting of N-channel MOS transistors NT1, NT2 which are cross-connected to each other.

These sense amplifiers PSA and NSA constitute a sense amplifier circuit for detecting and amplifying memory cell data.

When the voltage at an P-sense drive signal line S2P becomes an array power supply potential VDDS, P-sense amplifier PSA is activated and drives one of common bit lines CBL and ZCBL which is at a higher potential to the array power supply potential level. When signals on an N-sense drive signal line S2N becomes a ground potential level, N-sense amplifier NSA is activated and drives one of common bit lines CBL and ZCBL which is at a lower potential to the ground potential level.

In order to drive P-sense drive signal line S2P, there is provided an P-sense drive transistor 31 constituted by an P-channel MOS transistor which conducts, in response to an P-sense activation signal ZS0P being activated, to transfer the voltage at a high-side sense power supply trunk line HPL to P-sense drive signal line S2P. In order to drive N-sense drive signal line S2N, there is provided an N-sense drive transistor 32 constituted by an N-channel MOS transistor which conducts, in response to an N-sense activation signal S0N being activated, to connect a low-side sense power supply trunk line LPL to N-sense drive signal line S2N.

Sense power supply trunk line HPL is fed with array power supply potential VDDS in operation. In an over-drive sensing method, an external potential EXTVDD higher than array power supply potential VDDS is supplied to sense power supply trunk line HPL just before or after the start of the operation of sense amplifier circuit. Sense drive transistors 31, 32 are placed in a cross band CRS which corresponds to the area of intersection of a sub-word line driver band SWDB and a sense amplifier band SAB.

Figure 4:
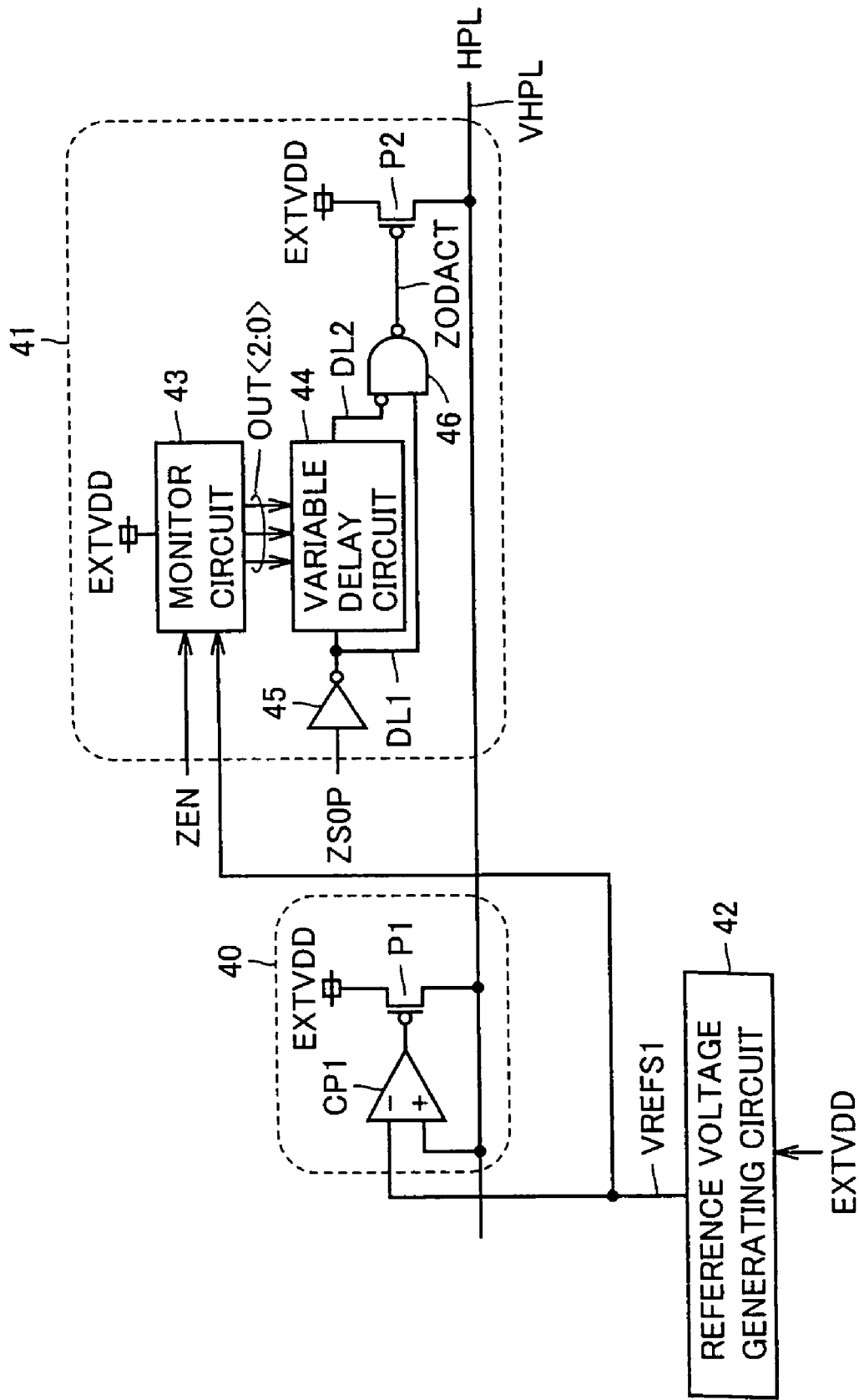
FIG. 4 is a block diagram illustrating the structure of sense power supply circuit 27 of FIG. 1.

FIG. 4 is a block diagram illustrating the structure of sense power supply circuit 27 of FIG. 1. Referring to FIG. 4, sense power supply circuit 27 includes an internal step-down circuit 40 for supplying array power supply potential VDDS at a constant potential to sense power supply trunk line HPL in FIG. 3, an over-drive circuit 41 for supplying external potential EXTVDD to sense power supply trunk line HPL for a proper time interval, and a reference voltage generating circuit 42 which receives external potential EXTVDD and generates a reference potential VREFS1, which serves as a reference when internal step-down circuit 40 and over-drive circuit 41 are operated.

Further, in FIG. 4, the potential which serves as a reference for internal step-down circuit 40 and the potential which serves as a reference for over-drive circuit 41 are shown to be provided from only reference voltage generating circuit 42. However, the present invention is not limited to this configuration, and individual reference voltage generating circuits may be provided for internal step-down circuit 40 and over-drive circuit 41.

Internal step-down circuit 40 includes a comparator CP1 for comparing the potential VHPL at sense power supply trunk line HPL with reference potential VREFS1, and an P-channel MOS transistor P1 for supplying a current to sense power supply trunk line HPL from an external power supply node, in response to output signals from comparator CP1.

Over-drive circuit 41 includes a monitor circuit 43 which, when activated by an activation signal ZEN, monitors external potential EXTVDD and outputs the potential level of external potential EXTVDD, by representing the potential level with logic of signals OUT<0>, OUT<1> and OUT<2>. Monitor circuit 43 will be described in detail later.

Further, in FIG. 4, signals of 3 bits are comprehensively represented as signals OUT<2:0>.

Over-drive circuit 41 further includes a variable delay circuit 44 for delaying the transmission of a signal DL1. Variable delay circuit 44 sets the delay time according to signals OUT<2:0> from monitor circuit 43. Variable delay circuit 44 receives signal DL1 and outputs a signal DL2 which is signal DL1 delayed by the set time. Variable delay circuit 44 will be described later in detail.

Over-drive circuit 41 further includes an inverter 45 for generating signal DL1 having a logical level reverse of that of P-sense activation signal ZS0P, and a logical gate 46 for performing a logical operation for signals DL1 and DL2. The result of the operation of logical gate 46 is output as a signal ZODACT specifying the time interval in which over-drive circuit 41 supplies external potential EXTVDD to sense power supply trunk line HPL. Namely, the time interval in which signal ZODACT is being at an L level depends on the delay time determined by variable delay circuit 44.

Over-drive circuit 41 further includes an P-channel MOS transistor P2 for supplying a current to sense power supply trunk line HPL from an external power supply node in response to signal ZODACT at the L level.

Over-drive circuit 41 will be described. Monitor circuit 43 for monitoring external potential EXTVDD and variable delay circuit 44 determine the time interval in which signal ZODACT is being at the L level according to the potential level of external potential EXTVDD, and thus the supplying time of external potential EXTVDD can be dynamically changed. When external potential EXTVDD is at the upper limit of specification of product, the supplying time is short, thereby preventing overcharge of memory cells or bit lines. When external potential EXTVDD is at the lower limit of specification of product, the supplying time becomes longer, thereby ensuring a sufficient over-driving time interval. It is possible to ensure the reliability of the memory cells and perform the reading operation throughout the entire range of the specification of product of external potential EXTVDD.

The range of external potential EXTVDD is varied depending on the semiconductor memory device. For example, the range thereof is set to 1.8 V ±0.1 V, for a pseudo static random access memory.

Figure 5:
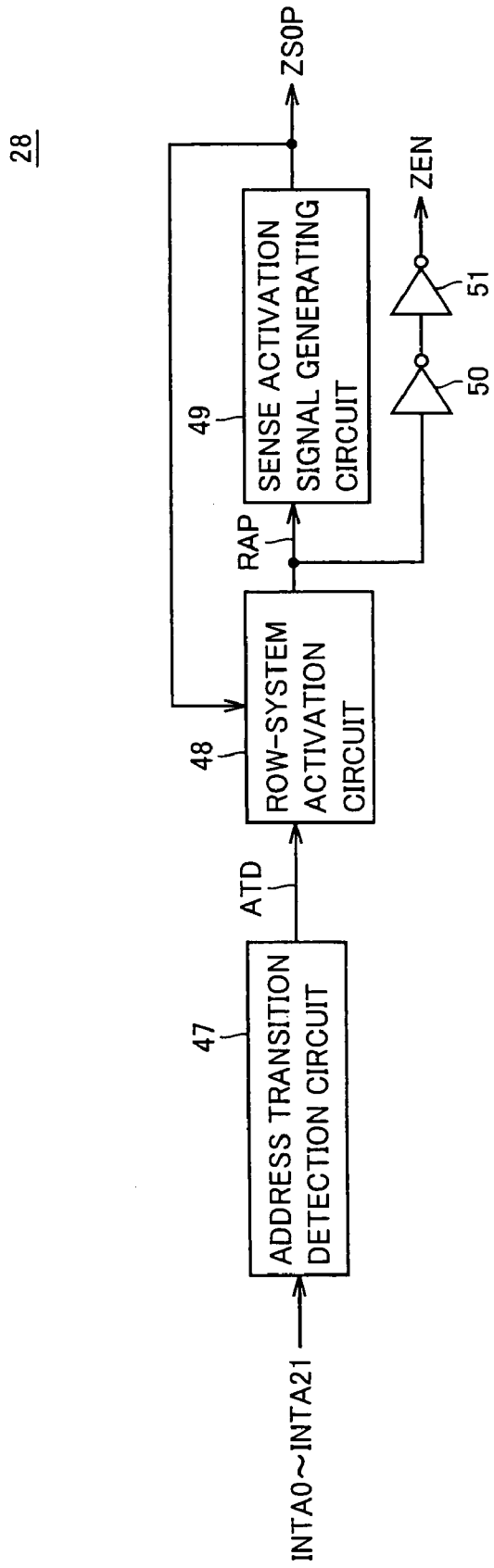
FIG. 5 is a block diagram illustrating the general outline of sense power supply control circuit 28 of FIG. 1.

FIG. 5 is a block diagram illustrating the general outlines of sense power supply control circuit 28 of FIG. 1. Referring to FIG. 5, sense power supply control circuit 28 includes an address transition detection circuit 47 which detects changes of any one of internal addresses INTA0 to INTA21 and generates an address transition detection signal ATD, a row-system activation circuit 48 which, on receiving address transition detection signal ATD, outputs a row-system operation command signal RAP for activating the row selecting operation, and a sense activation signal generating circuit 49 which, on receiving row-system operation command signal RAP, generates an P-sense activation signal ZS0P for activating the P-channel MOS transistor of the transistors constituting the sense amplifier, when the row selecting operation is activated.

Sense power supply control circuit 28 further includes inverters 50, 51 which generate an activation signal ZEN which is delayed from the transmission of row-system operation command signal RAP.

Figures 6, 7:
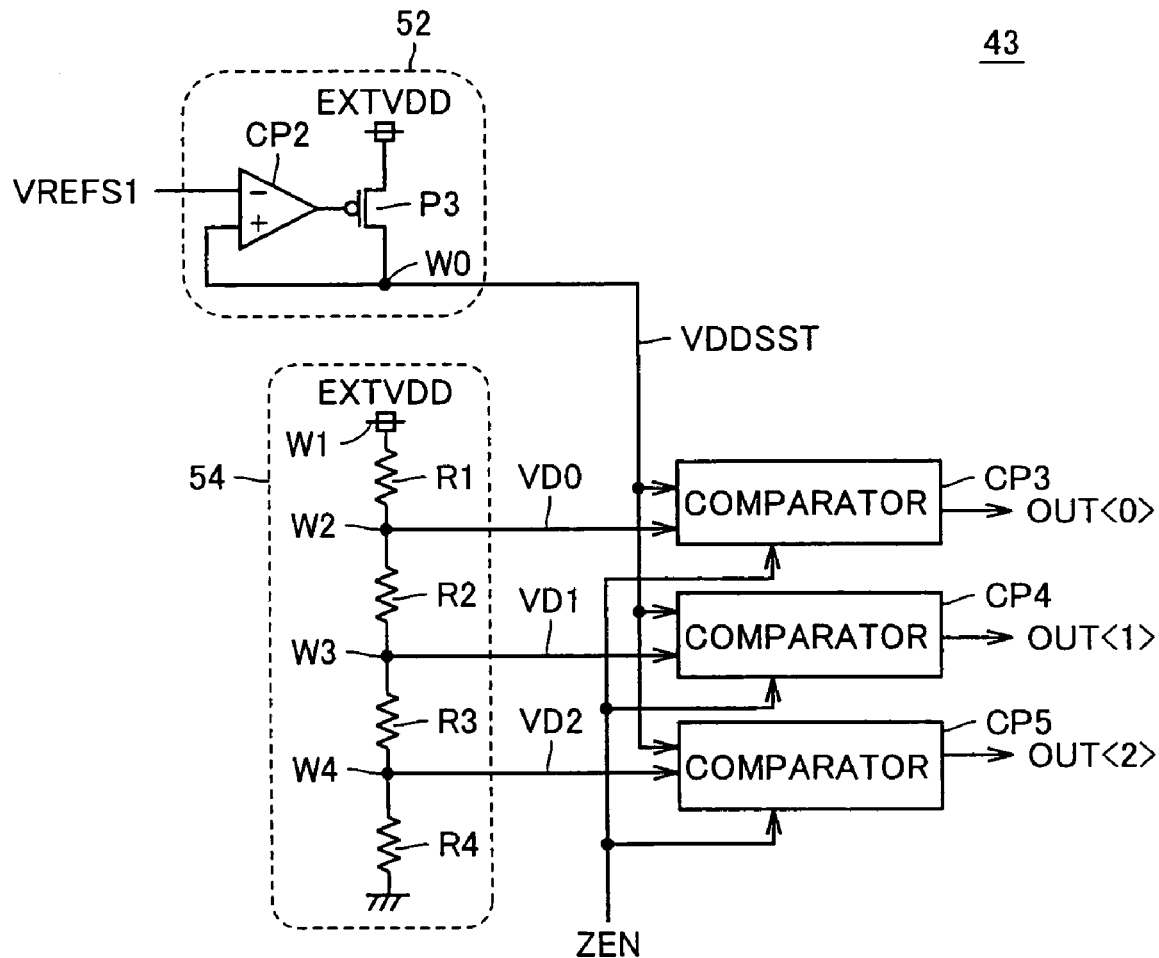
FIG. 6 is a concrete example of monitor circuit 43 illustrated in FIG. 4.
FIG. 7 is a view illustrating the truth table of signals OUT<0> to OUT<2>.

FIG. 6 is a concrete example of monitor circuit 43 illustrated in FIG. 4. Referring to FIG. 6, monitor circuit 43 includes an internal step-down circuit 52 for reducing external potential EXTVDD to provide a potential VDDSST which serves as a reference potential for monitoring the external potential.

Internal step-down circuit 52 includes a comparator CP2 for comparing potential VDDSST with reference potential VREFS1 and an P-channel MOS transistor P3 which, in response to output signals form comparator CP2, supplies a current to a node W0 from an external power supply node.

Monitor circuit 43 further includes a level conversion circuit 54 for converting external potential EXTVDD into a proper potential level.

Level conversion circuit 54 includes a resistance R1 connected between a node W1 which is supplied with external potential EXTVDD and a node W2 which outputs a potential VD0, a resistance R2 connected between node W2 and a node W3 which outputs a potential VD1, a resistance R3 connected between node W3 and a node W4 which outputs a potential VD2, and a resistance R4 connected between node W4 and a ground node.

Monitor circuit 43 further includes a comparator CP3 which outputs the result of comparison between potential VD0 and potential VDDSST as signal OUT<0>, a comparator CP4 which outputs the result of comparison between potential VD1 and potential VDDSST as signal OUT<1>, and a comparator CP5 which outputs the result of comparison between potential VD2 and potential VDDSST as signal OUT<2>.

Comparators CP3 to CP5 are activated by activation signal ZEN.

FIG. 7 is a view illustrating a truth table of signals OUT<0> to OUT<2>.

Referring to FIG. 7, when potential VD0 is equal to or lower than potential VDDSST, signals OUT<0> to OUT<2> are all at an L level.

When potential VD0 is greater than potential VDDSST and potential VD1 is equal to or lower than potential VDDST, signal OUT<0> is at an H level and signals OUT<1> and signal OUT<2> are at the L level.

When potential VD1 is greater than potential VDDSST and potential VD2 is equal to or lower than potential VDDSST, signals OUT<0> and OUT<1> are at the H level and signal OUT<2> is at the L level.

When potential VD2 is greater than potential VDDSST, signals OUT<0> to OUT<2> are all at the H level.

When potential VD0 is equal to or lower than potential VDDSST corresponds to when external potential EXTVDD is lower than the minimum value of the specification of product. Further, when potential VD2 is greater than potential VDDSST corresponds to when external potential EXTVDD is higher than the maximum value of the specification of product.

Figure 8:
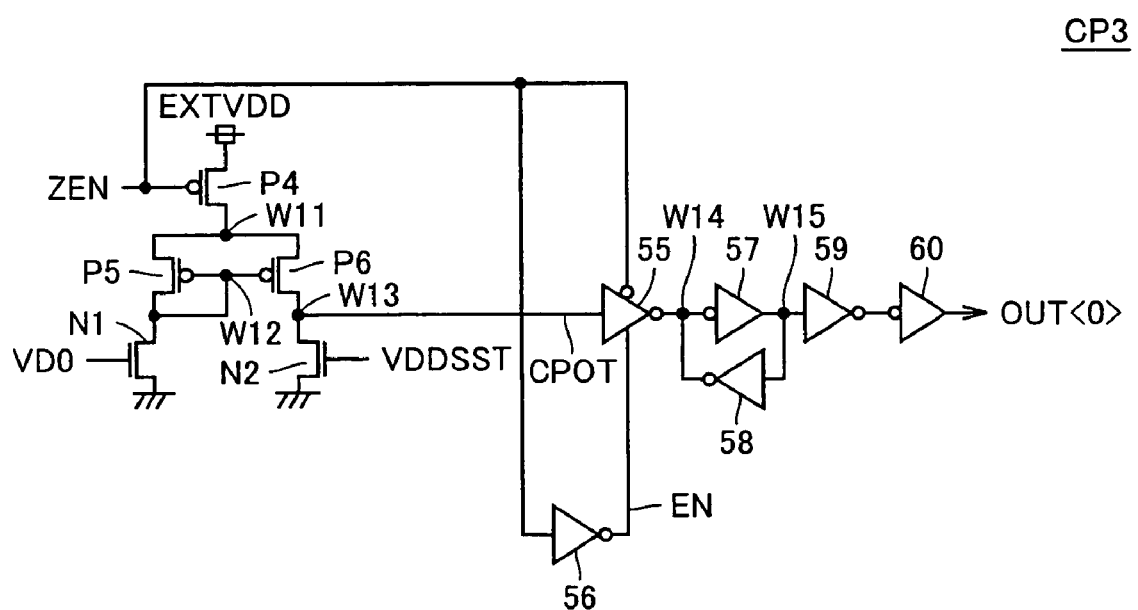
FIG. 8 is a circuit diagram illustrating the structure of comparator CP3 of FIG. 6.

FIG. 8 is a circuit diagram illustrating the construction of comparator CP3 of FIG. 6.

Referring to FIG. 8, comparator CP3 includes an P-channel MOS transistor P4 which is connected between a node W11 and an external power supply node and receives activation signal ZEN at the gate, the external power supply node being supplied with external potential EXTVDD. Comparator CP3 further includes an P-channel MOS transistor P5 which is connected at its source to node W11 and is connected at its gate and drain to a node W12, an N-channel MOS transistor N1 which is connected between node W12 and a ground node and receives potential VD0 at its gate, an P-channel MOS transistor P6 which is connected at the source to node W11, connected at the gate to node W12 and connected at the drain to a node W13, and an N-channel MOS transistor N2 which is connected between node W13 and the ground node and receives potential VDDSST at the gate. Node W13 outputs a signal CPOT indicating the result of the comparison between potential VDDSST and potential VD0.

Comparator CP3 includes a clocked inverter 55 which, when activation signal ZEN becomes the L level, reverses the logical level of signal CPOT and outputs it, and an inverter 56 which outputs a signal EN which is the inverse of activation signal ZEN. Activation signal ZEN and signal EN are input to clocked inverter 55.

Comparator CP3 further includes an inverter 57 which is connected at its input to a node W14 and connected at its output to a node W15, an inverter 58 which is connected at its input to node W15 and connected at its output to node W14, an inverter 59 connected at its input to the output of inverter 57, and an inverter 60 which is connected at its input to the output of inverter 59 and outputs signal OUT<0>.

Comparators CP4 and CP5 illustrated in FIG. 6 have a construction similar to that of comparator CP3 illustrated in FIG. 8 and output signals OUT<1> and OUT<2>, instead of signal OUT<0>. Therefore, description of comparators CP4, CP5 will not be repeated.

Figure 9:
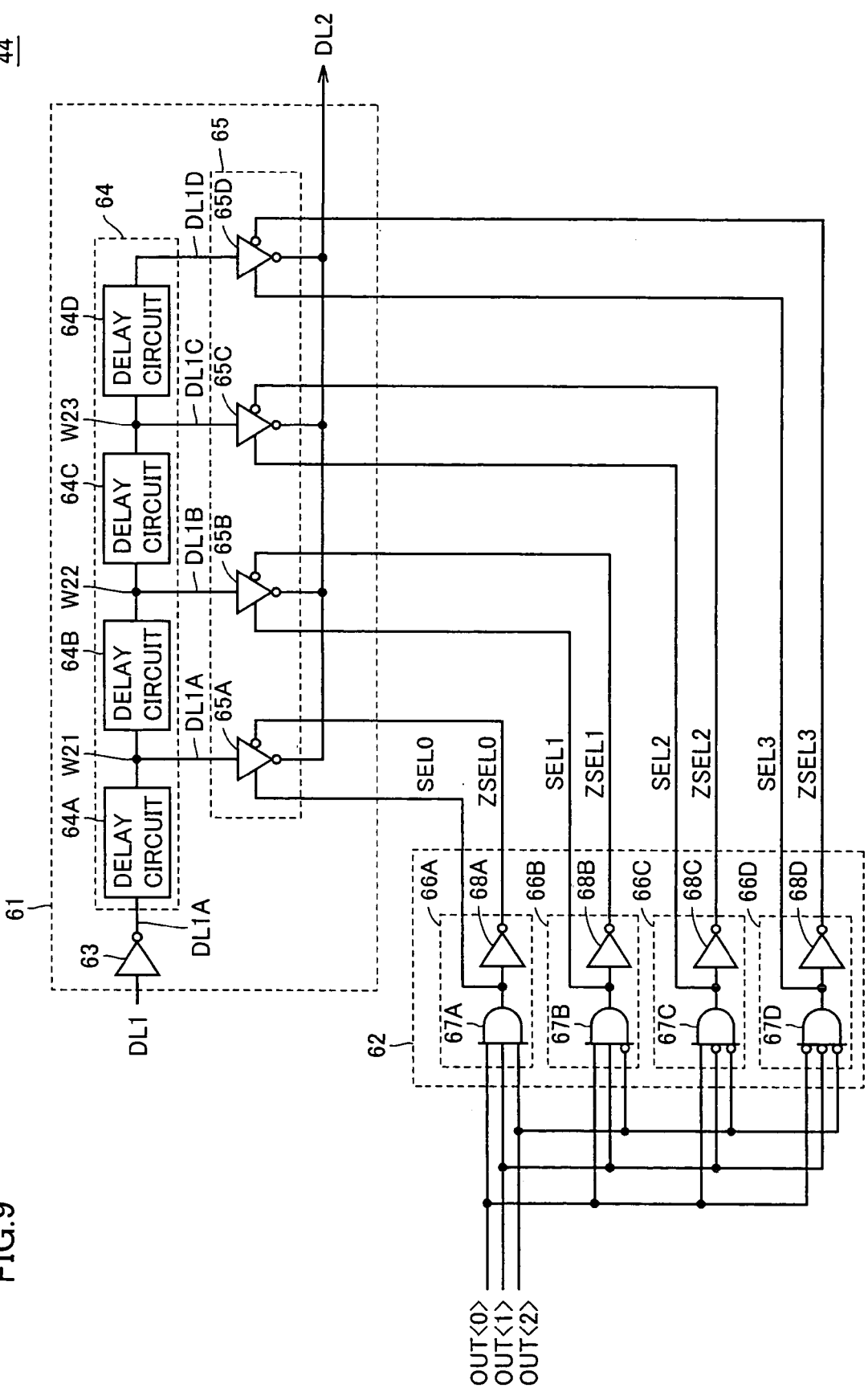
FIG. 9 is a block diagram illustrating the structure of variable delay circuit 44.

FIG. 9 is a block diagram illustrating the construction of variable delay circuit 44.

Referring to FIG. 9, variable delay circuit 44 includes a delay circuit portion 61 for delaying signal DL1 and outputting signal DL2, and a specification circuit portion 62 for outputting signals ZSEL0 to ZSEL3 and SEL0 to SEL3 for specifying the delay time according to the combination of the logical levels of signals OUT<0> to OUT<2>.

Delay circuit portion 61 includes an inverter 63 for outputting a signal DL1A having a logical level reverse of that of signal DL1, a delay determination portion 64 for determining the delay time of signal DL1A, and an output portion 65 for outputting a signal DL2.

Delay determination portion 64 includes a delay circuit 64A which applies a delay time DT0 to signals input from the output of inverter 63 and outputs a signal DL1A to a node W21, a delay circuit 64B which applies a delay time DT1 to signal DL1A and outputs a signal DL1B to a node W22, a delay circuit 64C which applies a delay time DT2 to signal DL1B and outputs a signal DL1C to a node W23, and a delay circuit 64D which applies a delay time DT3 to signal DL1C and outputs a signal DL1D.

Output portion 65 includes a clocked inverter 65A which, when signal ZSEL0 is at an L level, outputs a signal DL2 having a logical level reverse of that of signal DL1A, a clocked inverter 65B which, when signal ZSEL1 is at an L level, outputs signal DL2 having a logical level reverse of that of signal DL1B, a clocked inverter 65C which, when signal ZSEL2 is at an L level, outputs signal DL2 having a logical level reverse of that of signal DL1C, and a clocked inverter 65D which, when signal ZSEL3 is at an L level, outputs signal DL2 having a logical level reverse of that of signal DL1D.

Specification circuit 62 includes a specification portion 66A which, on receiving signals OUT<0> to OUT<2>, outputs a signal SEL0 and a signal ZSEL0 which is the inverse of signal SEL0, a specification portion 66B which, on receiving signals OUT<0> to OUT<2>, outputs a signal SEL1 and a signal ZSEL1 which is the inverse of signal SEL1, a specification portion 66C which, on receiving signals OUT<0> to OUT<2>, outputs a signal SEL2 and a signal ZSEL2 which is the inverse of signal SEL2, and a specification portion 66D which, on receiving signals OUT<0> to OUT<2>, outputs a signal SEL3 and a signal ZSEL3 which is the inverse of signal SEL3.

Specification portion 66A includes an AND circuit 67A which, when signals OUT<0> to OUT<2> are all at the H level, outputs signal SEL0 at the H level, and an inverter 68A which, on receiving signal SEL0, outputs signal ZSEL0.

Specification portion 66B includes a logical gate 67B which, when signals OUT<0> and OUT<1> are at the H level and signal OUT<2> is at the L level, outputs signal SEL1 at the H level, and an inverter 68B which, on receiving signal SEL1, outputs signal ZSEL1.

Specification portion 66C includes a logical gate 67C which, when signals OUT<0> is at the H level and signals OUT<1> and OUT<2> are at the L level, outputs signal SEL2 at the H level, and an inverter 68C which, on receiving signal SEL2, outputs signal ZSEL2.

Specification portion 66D includes a logical gate 67D which, when signals OUT<0> to OUT<2> are all at the L level, outputs signal SEL3 at the H level, and an inverter 68D which, on receiving signal SEL0, outputs signal ZSEL3 having a logical level reverse of that of signal SEL3.

Variable delay circuit 44 of FIG. 9 will be described. Depending on the combination of the logical levels of signals OUT<0> to OUT<2>, any of signals ZSEL0 to ZSEL3 becomes the L level, and any of clocked inverters 65A to 65D outputs signal DL2. The delay time is varied depending on which of signals ZSEL0 to ZSEL3 is being at the L level.

Further, delay times DT0 to DT3 are properly determined as required. Delay times DT0 to DT3 may be set to either the same time interval or different time intervals.

The combination of the logical levels of signals OUT<0> to OUT<2> corresponds to the truth table illustrated in FIG. 7. Namely, in FIG. 7, when potential VD2 is higher than that of potential VDDST, signals OUT<0> to signal OUT<2> are all at the H level. In this case, signal ZSEL0 is activated to the L level and thus the delay time becomes DT0. Namely, when external potential EXTVDD exceeds the maximum value of specification of product, the time interval in which the sense amplifier is fed with external potential EXTVDD becomes DT0, which is the shortest time interval.

On the other hand, in FIG. 7, when potential VD0 is equal to or lower than potential VDDSST, signals OUT<0> to OUT<2> are all at the L level. In this case, signal ZSEL3 is activated to the L level and thus the delay time becomes DT0+DT1+DT2+DT3. Namely, when external potential EXTVDD is below the minimum value of the specification of product, the time interval in which the sense amplifier is supplied with external potential EXTVDD becomes DT0+DT1+DT2+DT3, which is the longest time interval.

Figure 10:
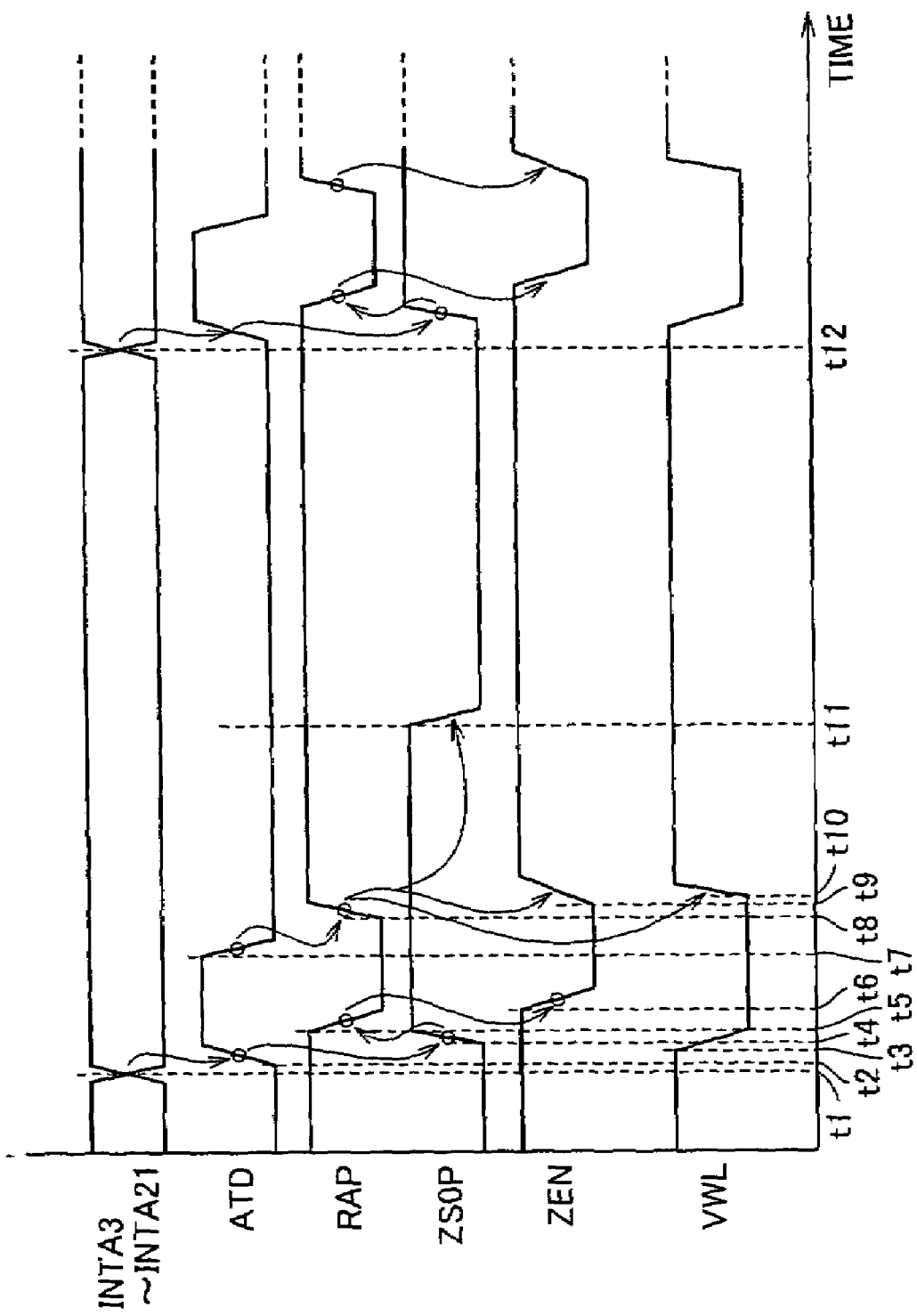
FIG. 10 is a timing chart illustrating the operation of sense power supply control circuit 28.

FIG. 10 is a timing chart illustrating the operation of sense power supply control circuit 28.

Referring to FIG. 10, at first, at the time t1, the logical level of any of internal addresses INTA3 to INTA21 is switched, and thus the row reading operation for the memory cells is started.

Internal addresses INTA0 to INTA2 are used for the column reading operation. In FIG. 10, there are illustrated only internal addresses INTA3 to INTA21 relating to the operation of the sense amplifier circuit.

In response to the switching of internal addresses INTA3 to INTA21 at the time t1, address transition detection signal ATD rises to the H level at the time t2.

Then, at the time t3, in response to address transition detection signal ATD raised to the H level, the potential VWL at word line WL of FIG. 3 becomes the L level. Further, potential VWL is varied between a potential VPP and a ground potential VSS. In description about potential VWL which will be given later, potential VPP will be referred to as an "H level" and ground potential VSS will be referred to as an "L level", for the sake of convenience.

Then, at the time t4, in response to address transition detection signal ATD raised to the H level, P-sense activation signal ZS0P rises to the H level.

Then, at the time t5, in response to P-sense activation signal ZS0P raised to the H level, row-system command signal RAP descends to the L level.

Then, at the time t6, in response to row-system command signal RAP descended to the L level, activation signal ZEN descends to the L level.

Then, at the time t7, address transition detection signal ATD descends to the L level.

At the time t8, row-system operation command signal RAP rises to the H level and at the time t9, in response to row-system operation command signal RAP raised to the H level, activation signal ZEN rises to the H level from the L level.

At the time t10, in response to row-system operation command signal RAP raised to the H level, potential VWL rises to the H level.

Further, at the time t11, in response to row-system operation command signal RAP raised to the H level, P-sense activation signal ZS0P descends to the L level.

Then, at the time t12, internal addresses INTA3 to INTA21 are switched again, and the next row reading operation is started. The respective operation waveforms after the time t12 are the same as those at times t1 to t12. Therefore, description about the operations from then on will not be repeated.

Figure 11:
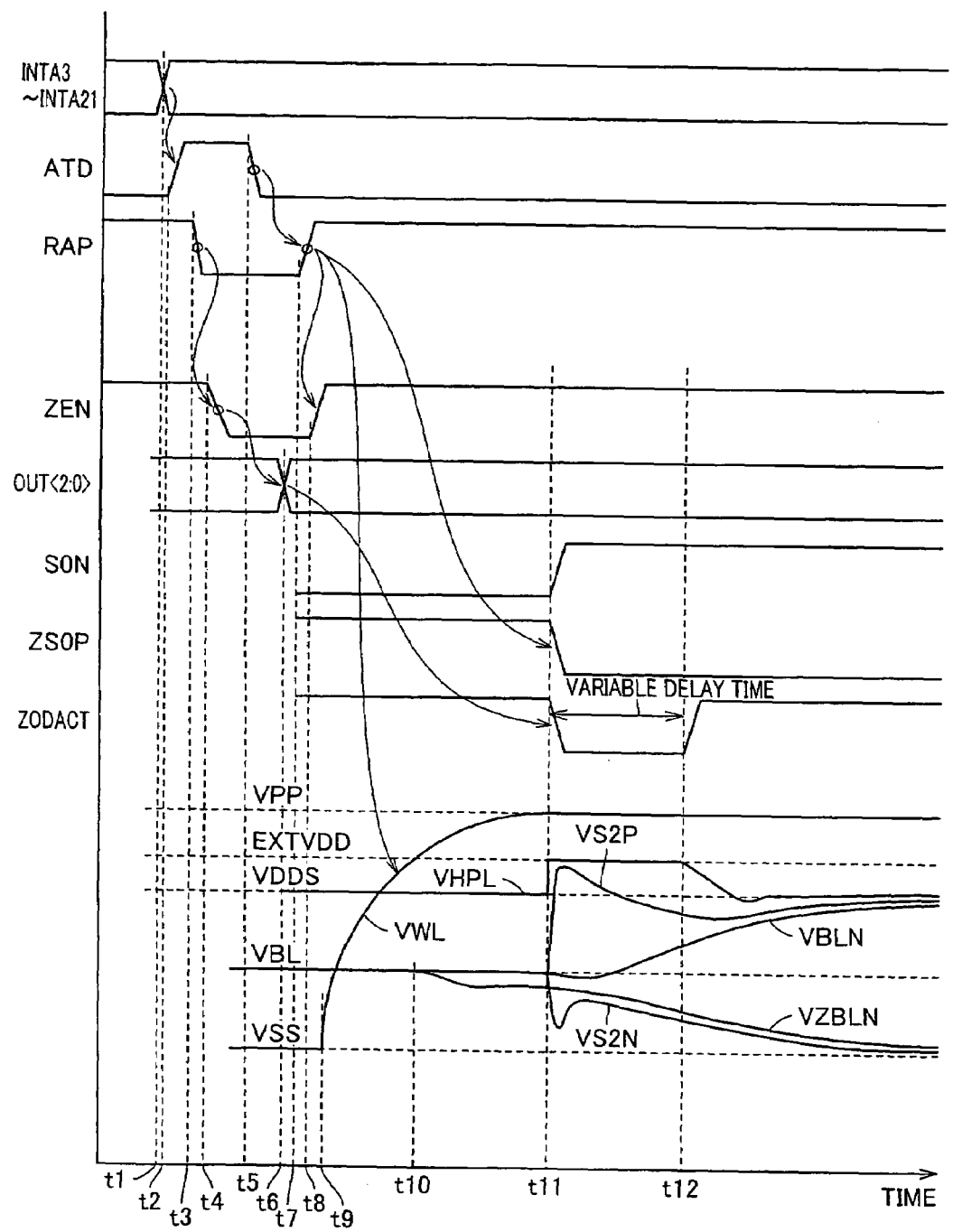
FIG. 11 is an operation waveform diagram of the sense amplifier according to the over-drive sensing method.

FIG. 11 is an operation waveform diagram of the sense amplifier according to the over-drive sensing method.

Referring to FIG. 11, in the signal waveform diagram, as the signal waveforms of the circuits of sense amplifier bands, there are illustrated N-sense activation signal SON, P-sense activation signal ZS0P, potential VWL at word line WL, the potential VHPL at the sense amplifier, the potential VS2P at sense drive signal line S2P, the potential VS2N at sense drive signal line S2N, the potential VBLN at common bit line CBL, and the potential VZBLN at common bit line ZCBL.

Further, in the signal waveform diagram, there are illustrated signals OUT<2:0> and signal ZODACT in over-drive circuit 41 of FIG. 4, internal addresses INTA3 to A21, address transition detection signal ATD, row-system operation command signal RAP, and activation signal ZEN in sense power supply control circuit 28 of FIG. 5.

For potential VWL, potential VHPL, potential VS2P, potential VBLN and potential VZBLN, the vertical axis in the figure designates the potential differences for the respective potential.

The operations from the time t1 to the time t4 are the same as those from the time t1 to the time t6 in the timing chart of FIG. 10.

First, at the time t1, internal addresses INTA3 to INTA21 are switched and at the time t2, address transition detection signal ATD rises to the H level. At the time t3, row-system command signal RAP descends to the L level. At the time t4, in response to row-system command signal RAP descended to the L level at the time t3, activation signal ZEN descends to the L level from the H level. In response to the switching of activation signal ZEN to the L level at the time t4, monitor circuit 43 in FIG. 4 monitors the potential of external potential EXTVDD.

Then, at the time t6, monitor circuit 43 switches signals OUT<2:0> according to the result of monitoring of external potential EXTVDD. The supplying time of external potential EXTVDD in the over-drive sensing operation is determined depending on the combination of the logical levels of OUT<2:0>.

On the other hand, in response to address transition detection signal ATD descended to the L level, row-system operation command signal RAP rises to the H level at the time t7. Then, at the time t8, in response to row-system operation command signal RAP raised to the H level, activation signal ZEN rises to the H level. In response to activation signal ZEN raised to the H level, monitor circuit 43 of FIG. 4 terminates monitoring of external potential EXTVDD.

In response to address transition detection signal ATD descended to the L level at the time t5, the row selecting operation is performed at the time t9. When the row selecting operation is performed, potential VWL rises from ground potential VSS and finally reaches potential VPP. With potential VWL rises, data is read from the selected memory cells into the corresponding bit lines.

Potential VS2P and potential VS2N at sense drive signal line S2N are both maintained at an intermediate potential VBL before the time t10.

Then, at the time t11, P-sense activation signal ZS0P is brought into the L level and N-sense activation signal ZS0N is brought into the H level. Sense drive signal line S2P illustrated in FIG. 3 is connected to sense power supply trunk line HPL, thereby rising the voltage level.

Further, at the time t11, signal ZODACT is switched to the L level. As illustrated in over-driving circuit 41 of FIG. 4, when signal ZODACT is brought into the L level, external potential EXTVDD is applied to sense power supply trunk line HPL. Thus, at the time t11, potential VHPL at sense power supply trunk line HPL rises to external potential EXTVDD from array power supply potential VDDS.

With potential VHPL rises to external potential EXTVDD at the time t11, potential VS2P at sense drive signal line S2P also rises to external potential EXTVDD. Therefore, a sufficient driving potential can be applied to P-channel MOS transistors PT1 and PT2 in P-sense amplifier PSA of FIG. 3, thereby enabling performing the sensing operation at a high speed.

Then, when signal ZODACT is switched to the H level at the time t12, the supplying of external potential EXTVDD to sense power supply trunk line HPL is terminated. Potential VHPL at sense power supply trunk line HPL gradually decreases due to current consumption during the operations of memory cells, etc., and finally reaches array power supply potential VDDS.

Further, in the signal waveform diagram of FIG. 11, there is illustrated signal ZODACT being switched to the L level at the same time that P sense activation signal ZS0P is switched to the L level. However, the present invention is not limited to the timing of the switching of signal ZODACT to the L level being simultaneous with the timing of the switching of sense activation signal ZS0P to the L level. For example, signal ZODACT may be switched to the L level before the timing of switching of sense activation signal ZS0P to the L level, and potential VHPL may be raised to external potential EXTVDD before the start of sensing operations.

Further, in the present embodiment, the time interval since row-system operation command signal RAP descends from the H level to the L level in response to the rise of address change detection signal ATD and until it rises to the H level again is defined as a row-system inactivation time interval and, according to this time interval, there is provided a time interval for monitoring external potential EXTVDD. However, the time interval for monitoring external potential EXTVDD is not limited to this time interval. For example, in the case of DRAMs or SDRAMs, it is possible to provide a time interval for monitoring external potential EXTVDD, according to the inactivation time interval of signals which is generally referred to as RAS (row address strobe signal).

Second Embodiment

Figure 12:
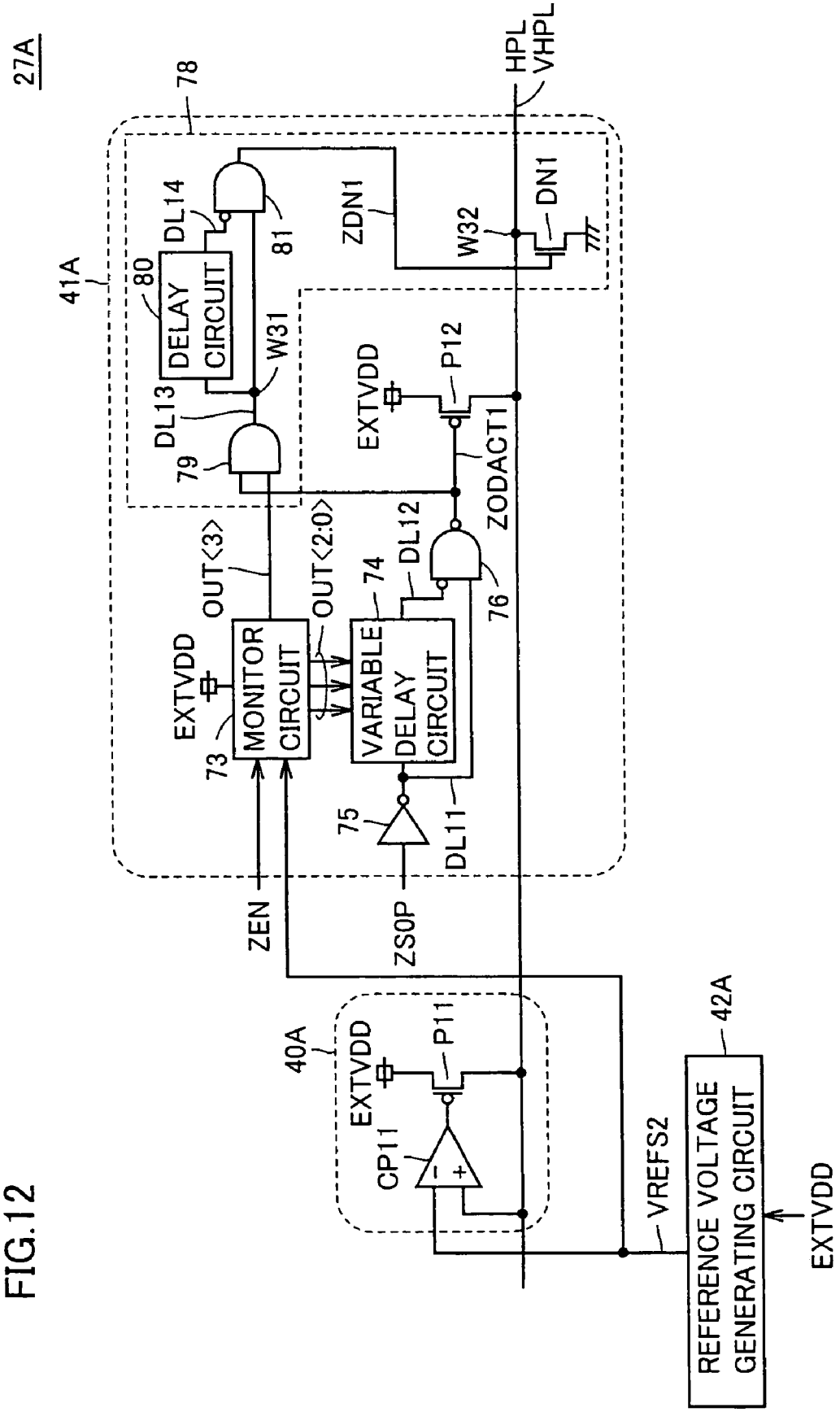
FIG. 12 is a block diagram illustrating the structure of sense power supply circuit 27A according to the second embodiment.

FIG. 12 is a block diagram illustrating the construction of a sense power supply circuit 27A according to the second embodiment.

Sense power supply circuit 27A according to the second embodiment reduces the potential VHPL at sense power supply trunk line HPL in the case where a higher external potential EXTVDD is applied to sense power supply trunk line HPL. By reducing potential VHPL, the reliability of the memory cells is ensured. A higher external potential EXTVDD refers to, for example, a high potential exceeding the specification of product of external potential EXTVDD. However, even when the potential of external potential EXTVDD is within the specification of product, sense power supply circuit 27A according to the second embodiment may be applied according to the potential difference between external potential EXTVDD and potential VHPL at sense power supply trunk line HPL. In the second embodiment, there will be described an example where sense power supply circuit 27A reduces the potential VHPL at sense power supply trunk line HPL when external potential EXTVDD is at a high potential higher than the specification of product.

Referring to FIG. 12, sense power supply circuit 27A includes an internal step-down circuit 40A for supplying array power supply potential VDDS at a constant potential to sense power supply trunk line HPL illustrated in FIG. 3, an over-driving circuit 41A for supplying external potential EXTVDD to sense power supply trunk line HPL for a proper time interval, and a reference voltage generating circuit 42A which receives external potential EXTVDD and supplies a reference potential VREFS2 which serves as a reference when internal step-down circuit 40A and over-driving circuit 41A are operated.

Further, in FIG. 12, the potential which serves as a reference for internal step-down circuit 40A and the potential which serves as a reference for over-drive circuit 41A are illustrated to be provided from only reference voltage generating circuit 42A. However, the present invention is not limited to this configuration, and similarly to FIG. 4, individual reference voltage generating circuits may be provided for internal step-down circuit 40A and over-drive circuit 41A.

Internal step-down circuit 40A includes a comparator CP11 for comparing the potential VHPL at sense power supply trunk line HPL with reference potential VREFS2, and an P-channel MOS transistor P11 for supplying a current to sense power supply trunk line HPL from an external power supply node, in response to output signals from comparator CP11.

Over-drive circuit 41A includes a monitor circuit 73 which, when activated by an activation signal ZEN, monitors external potential EXTVDD and outputs the potential level of external potential EXTVDD, by representing the potential level with logic of signals OUT<0>, OUT<1> and OUT<2>. Monitor circuit 73 will be described in detail later.

Over-drive circuit 41A further includes a variable delay circuit 74 for delaying the transmission of signals DL11. Variable delay circuit 74 sets the delay time according to signals OUT<2:0> from monitor circuit 73. Variable delay circuit 74 receives signal DL11 and outputs a signal DL12 which is signal DL11 delayed by the set time.

Further, variable delay circuit 74 has a construction similar to that of variable delay circuit 44 illustrated in FIG. 4 and therefore description from then on will not be repeated.

Over-drive circuit 41A further includes an inverter 75 for generating signal DL11 having a logical level reverse of that of P-sense activation signal ZS0P, and a logical gate 76 for performing a logical operation for signals DL11 and DL12. The result of the operation of logical gate 76 is output as a signal ZODACT1 specifying the time interval in which over-drive circuit 41A supplies external potential EXTVDD to sense power supply trunk line HPL. Namely, the time interval in which signal ZODACT1 is being at an L level depends on the delay time determined by variable delay circuit 74.

Over-drive circuit 41A further includes an P-channel MOS transistor P12 for supplying a current to sense power supply trunk line HPL from an external power supply node in response to signal ZODACT1 at an L level.

Over-drive circuit 41A further includes a step-down circuit potion 78 which, in response to external potential EXTVDD being equal to or higher than a set value, reduces potential VHPL.

Step-down circuit portion 78 includes an AND circuit 79 which outputs the result of logical multiplication of signal OUT<3> and signal ZODACT1 to a node W31 as a signal DL13, a delay circuit 80 for outputting a signal DL14 which is delayed signal DL13, a logical gate 81 which outputs the result of logical operations for signal DL13 and DL14 as a signal ZDN1, and an N-channel MOS transistor DN1 which is connected between a node W32 and a ground node and receives signal ZDN1 at its gate.

Over-drive circuit 41A will be described. Similarly to over-drive circuit 41 of FIG. 4, the time interval in which signal ZODACT1 is being at the L level is dynamically determined depending on the potential of external potential EXTVDD. When detected external potential EXTVDD exceeds the specification of product, step-down circuit portion 78 causes N-channel MOS transistor DN1 to conduct for a predetermined time interval to reduce potential VHPL.

Figure 13:
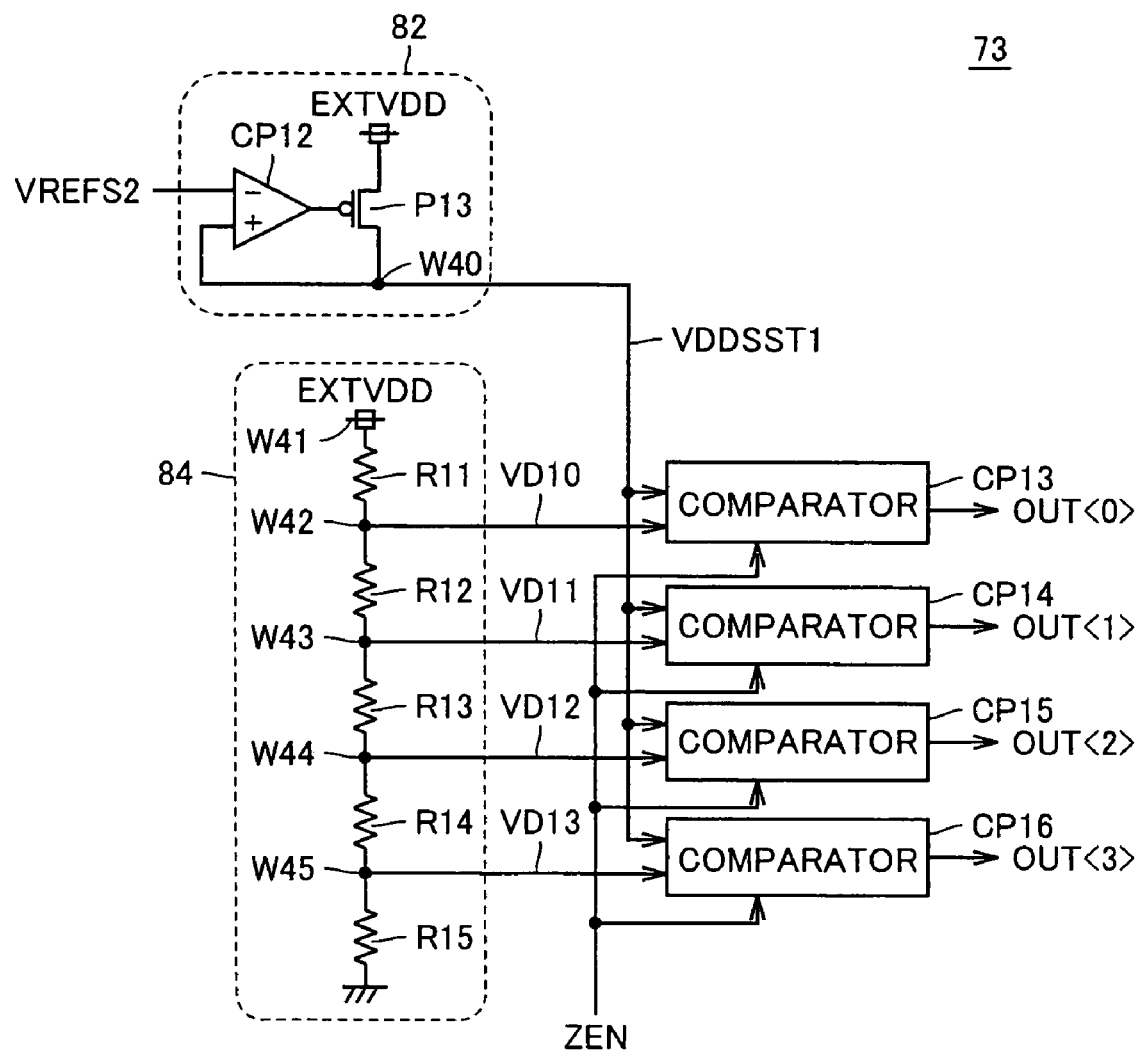
FIG. 13 is a concrete example of monitor circuit 73.

FIG. 13 is a concrete example of monitor circuit 73. Referring to FIG. 13, monitor circuit 73 includes an internal step-down circuit 82 for reducing external potential EXTVDD to generate a potential VDDSST1.

Internal step-down circuit 82 includes a comparator CP12 for comparing a potential VDDSST1 with reference potential VREFS2 and an P-channel MOS transistor P13 which, in response to output signals from comparator CP12, supplies a current to a node W40 from an external power supply node.

Monitor circuit 73 further includes a level conversion circuit 84 for converting external potential EXTVDD into a proper potential level.

Level conversion circuit 84 includes a resistance R11 connected between a node W41 which is fed with external potential EXTVDD and a node W42 which outputs a potential VD10, a resistance R12 connected between node W42 and a node W43 which outputs a potential VD11, a resistance R13 connected between node W43 and a node W44 which outputs a potential VD12, and a resistance R14 connected between node W44 and a node W45 which outputs a potential VD13 and a resistance R15 connected between a node W45 and a ground node.

Monitor circuit 73 further includes a comparator CP13 which outputs the result of comparison between potential VD10 and potential VDDSST1 as a signal OUT<0>, a comparator CP14 which outputs the result of comparison between potential VD11 and potential VDDSST1 as a signal OUT<1>, a comparator CP15 which outputs the result of comparison between potential VD12 and potential VDDSST1 as a signal OUT<2>, and a comparator CP16 which outputs the result of comparison between potential VD13 and potential VDDSST1 as a signal OUT<3>.

Comparators CP13 to CP16 are activated by activation signal ZEN. Further, comparators CP13 to CP16 have the same construction as that of comparator CP3 illustrated in FIG. 8, and therefore description thereof will not be repeated.

Figure 14:
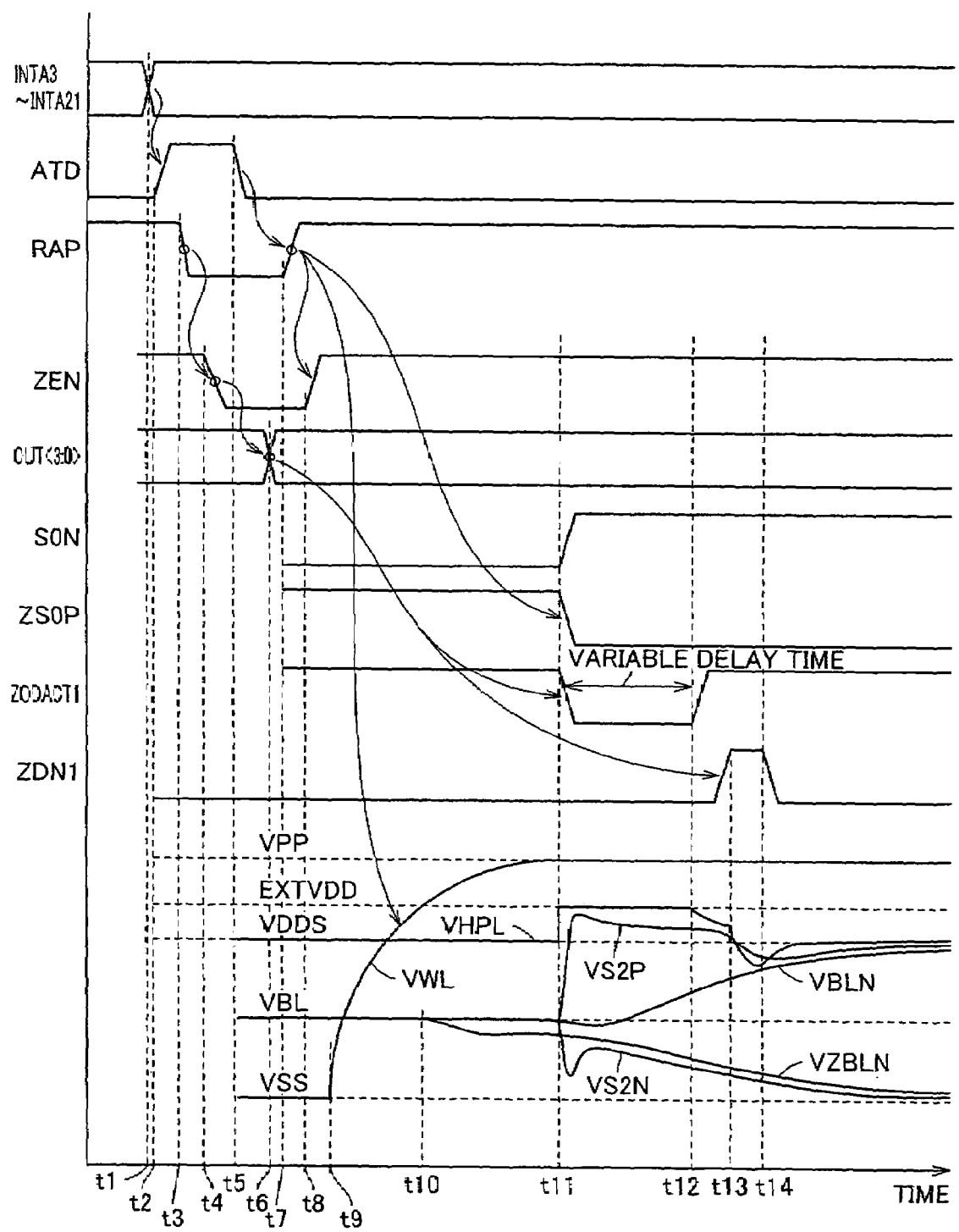
FIG. 14 is an operation waveform diagram of the sense amplifier in the case where the potential of external potential EXTVDD exceeds the spec.

FIG. 14 is an operation waveform diagram of the sense amplifier in the case where the potential of external potential EXTVDD exceeds the specification of product.

The signal waveform diagram in the case where external potential EXTVDD is within the specification of product is the same as that illustrated in FIG. 11. Therefore, description about the case where external potential EXTVDD is within the specification of product will not be repeated.

Referring to FIG. 14, the changes in the signal waveforms at the times t1 to t12 are the same as the changes in the signal waveforms at the time t1 to the time t12 illustrated in FIG. 11. Therefore, the description from then on will not repeated.

When external potential EXTVDD exceeds the specification of product, signal ZDN1 rises after signal ZODACT1 rises to the H level at the time t12.

When signal ZDN1 rises to the H level at the time t13, N-channel MOS transistor DN1 illustrated in FIG. 12 conducts and thus potential VHPL rapidly drops.

Then, when signal ZDN1 drops at the time t13, N-channel MOS transistor DN1 is brought into a non-conducting state. Potential VHPL is restored to array power supply potential VDDS by internal step-down circuit 40A.

Further, similarly to the signal waveform diagram of FIG. 11, the present invention is not limited to the timing of the switching of signal ZODACT1 to the L level being simultaneous with the timing of switching of sense activation signal ZS0P to the L level. For example, signal ZODACT1 may be switched to the L level before the timing of switching of sense activation signal ZS0P to the L level.

Third Embodiment

Figure 15:
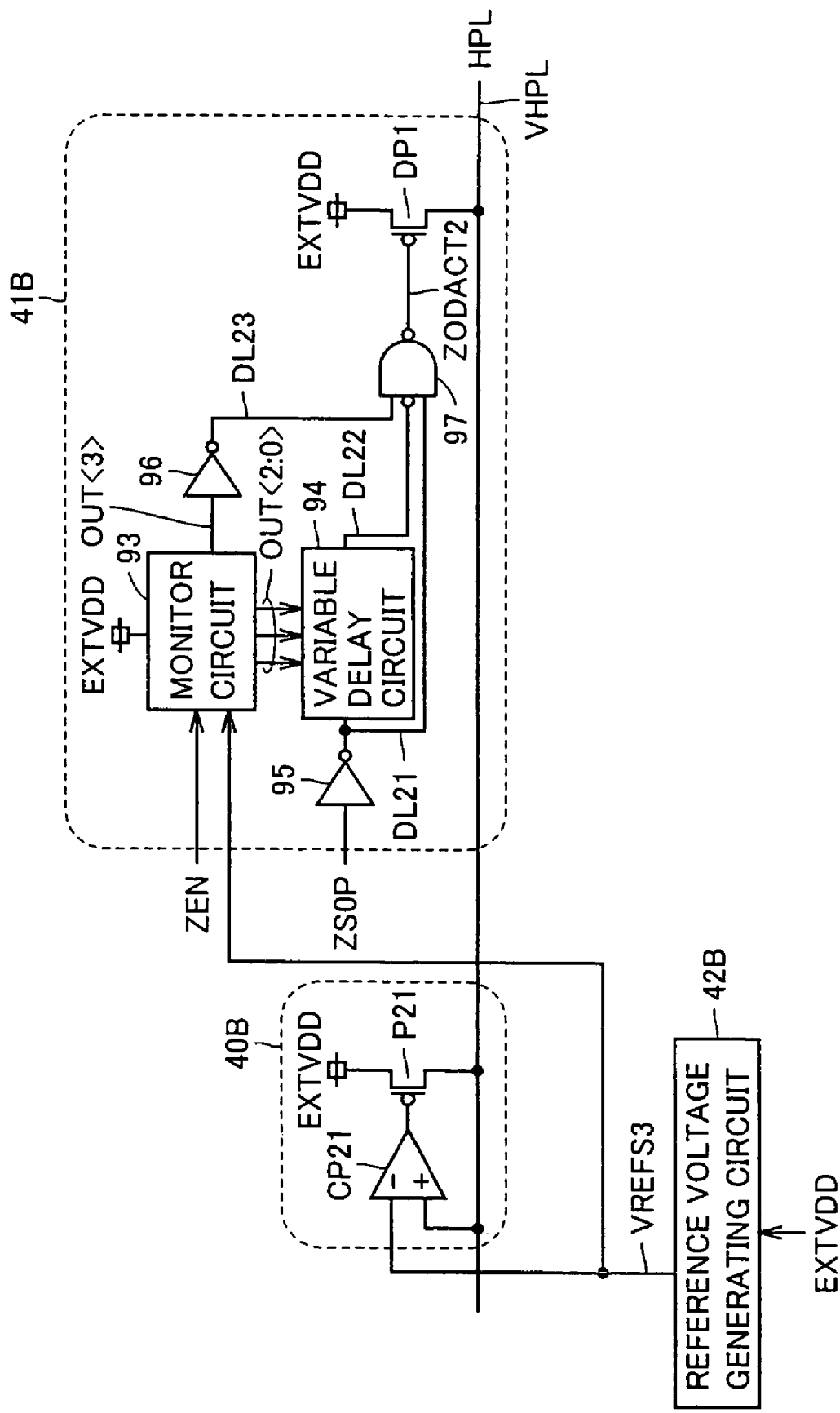
FIG. 15 is a block diagram illustrating the structure of sense power supply circuit 27B according to the third embodiment.

FIG. 15 is a block diagram illustrating the construction of a sense power supply circuit 27B according to the third embodiment.

Sense power supply circuit 27B according to the third embodiment terminates supplying of external potential EXTVDD to sense power supply trunk line HPL when a higher external potential EXTVDD is applied to sense power supply trunk line HPL. Thus, sense power supply trunk line HPL is fed with a potential VHPL which is lower than external potential EXTVDD, thereby ensuring the reliability of the memory cells. A higher external potential EXTVDD refers to, for example, a high potential exceeding the specification of product of external potential EXTVDD, similarly to the example of sense power supply circuit 27A according to the second embodiment. However, even when the potential of external potential EXTVDD is within the specification of product, sense power supply circuit 27B according to the third embodiment may be applied according to the potential difference between external potential EXTVDD and the potential VHPL at sense power supply trunk line HPL. In the third embodiment, there will be described an example where sense power supply circuit 27B terminates supplying of external potential EXTVDD to sense power supply trunk line HPL when external potential EXTVDD is at a high potential higher than the specification of product.

Referring to FIG. 15, sense power supply circuit 27B includes an internal step-down circuit 40B for supplying array power supply potential VDDS at a constant potential to sense power supply trunk line HPL illustrated in FIG. 3, an over-driving circuit 41B for supplying external potential EXTVDD to sense power supply trunk line HPL for a proper time interval, and a reference voltage generating circuit 42B which receives external potential EXTVDD and generates a reference potential VREFS3 which serves as a reference when internal step-down circuit 40B and over-driving circuit 41B are operated.

Further, in FIG. 15, the potential which serves as a reference for internal step-down circuit 40B and the potential which serves as a reference for over-drive circuit 41B are illustrated to be provided from only reference voltage generating circuit 42B. However, the present invention is not limited to this configuration, and individual reference voltage generating circuits may be provided for internal step-down circuit 40B and over-drive circuit 41B, similarly to FIG. 4.

Internal step-down circuit 40B includes a comparator CP21 for comparing the potential VHPL at sense power supply trunk line HPL with reference potential VREFS3, and an P-channel MOS transistor P21 for supplying a current to sense power supply trunk line HPL from an external power supply node, in response to output signals from comparator CP21.

Over-drive circuit 41B includes a monitor circuit 93 which, when activated by an activation signal ZEN, monitors external potential EXTVDD and outputs the potential level of external potential EXTVDD, by representing the potential level with logic of signals OUT<0>, OUT<1> and OUT<2>. Monitor circuit 93 has the same construction as that of monitor circuit 73. Therefore, the description from then on will not be repeated.

Over-drive circuit 41B further includes a variable delay circuit 94 for delaying the transmission of signals DL21. Variable delay circuit 94 sets the delay time according to signal OUT<2:0> from monitor circuit 93. Variable delay circuit 94 receives signal DL21 and outputs a signal DL22 which is signal DL21 delayed by the set time. Further, variable delay circuit 94 has the same construction as that of variable delay circuit 44 and therefore the description from then on will not be repeated.

Over-drive circuit 41B further includes an inverter 95 for generating a signal DL21 having a logical level reverse of that of P-sense activation signal ZS0P, an inverter 96 for outputting a signal DL23 having a logical level reverse of that of signal OUT<3> and a logical gate 97 for performing a logical operation for signals DL21 to DL23. The result of the operation of logical gate 97 is output as a signal ZODACT2 specifying the time interval in which over-drive circuit 41B supplies external potential EXTVDD to sense power supply trunk line HPL. Namely, the time interval in which signal ZODACT2 is being at an L level depends on the delay time determined by variable delay circuit 94.

Over-drive circuit 41B further includes an P-channel MOS transistor DPI for supplying a current to sense power supply trunk line HPL from an external power supply node in response to signal ZODACT2 at an L level.

Over-drive circuit 41B will be described. Similarly to over-drive circuit 41 of FIG. 4, the time interval in which signal ZODACT2 is being at the L level is dynamically determined depending on the potential of external potential EXTVDD. When detected external potential EXTVDD exceeds the specification of product, monitor circuit 93 outputs signal OUT<3> at the H level and the level of ZODACT2 is brought into the H level. P-channel MOS transistor DP is not driven and thus sense power supply trunk line HPL is not supplied with external potential EXTVDD.

Figure 16:
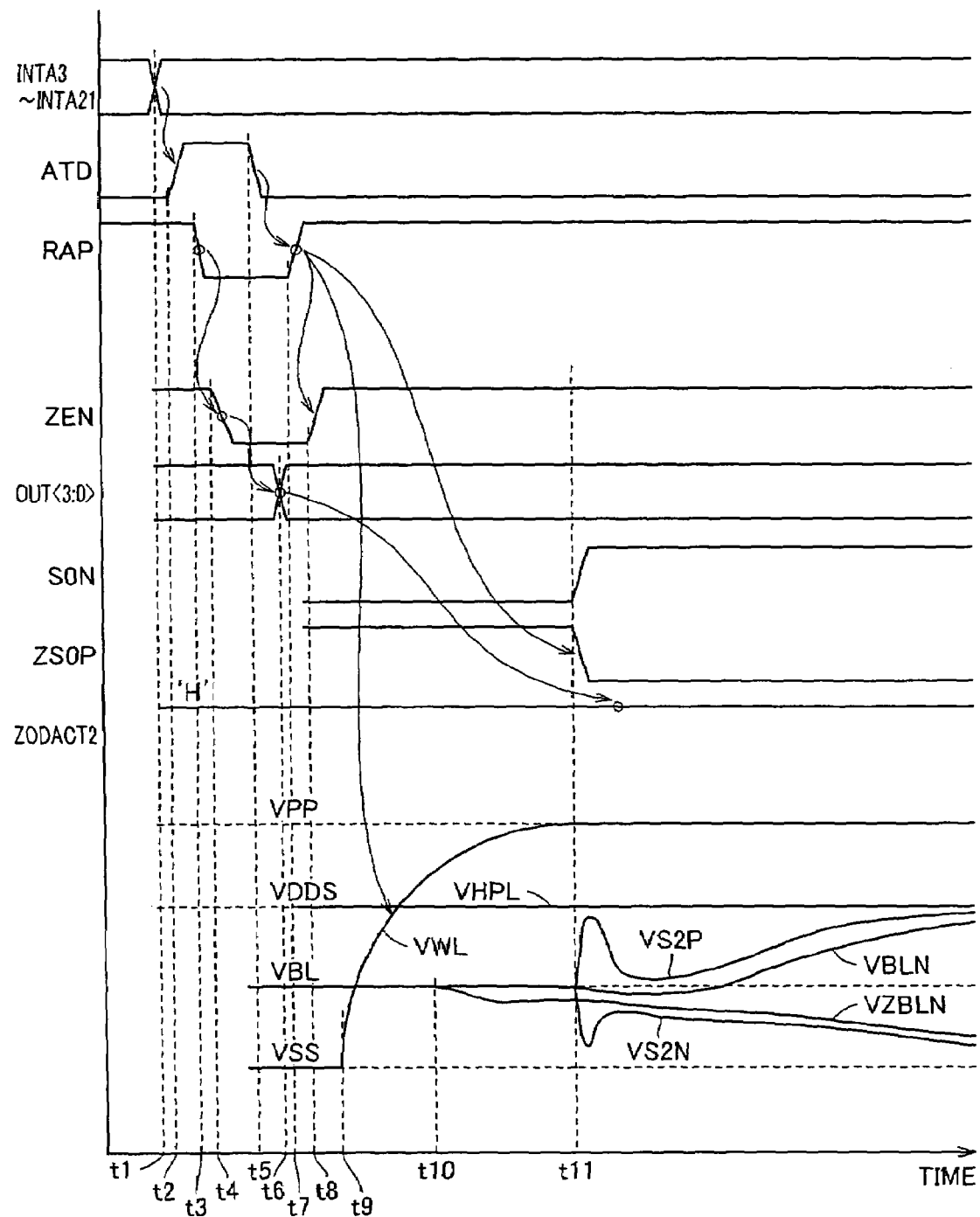
FIG. 16 is an operation waveform diagram of the sense amplifier in the case where the potential of external potential EXTVDD exceeds the spec.

FIG. 16 is an operation waveform diagram of the sense amplifier in the case where the potential of external potential EXTVDD exceeds the specification of product.

The signal waveform diagram in the case where external potential EXTVDD is within the specification of product is the same as the signal waveform diagram illustrated in FIG. 11. Therefore, description of the signal waveform diagram in the case where external potential EXTVDD is within the specification of product will not be repeated.

Referring to FIG. 16, the changes in the signal waveforms at the times t1 to t11 are the same as the changes in the signal waveforms at the times t1 to t11 illustrated in FIG. 11. Therefore, the description from then on will not be repeated.

In FIG. 16, when external potential EXTVDD is at a potential exceeding the maximum value of the specification of product, signal ZODACT 2 is maintained at the H level, at the time t1. Therefore, potential VHPL is maintained at array power supply potential VDDS.

Fourth Embodiment

Figure 17:
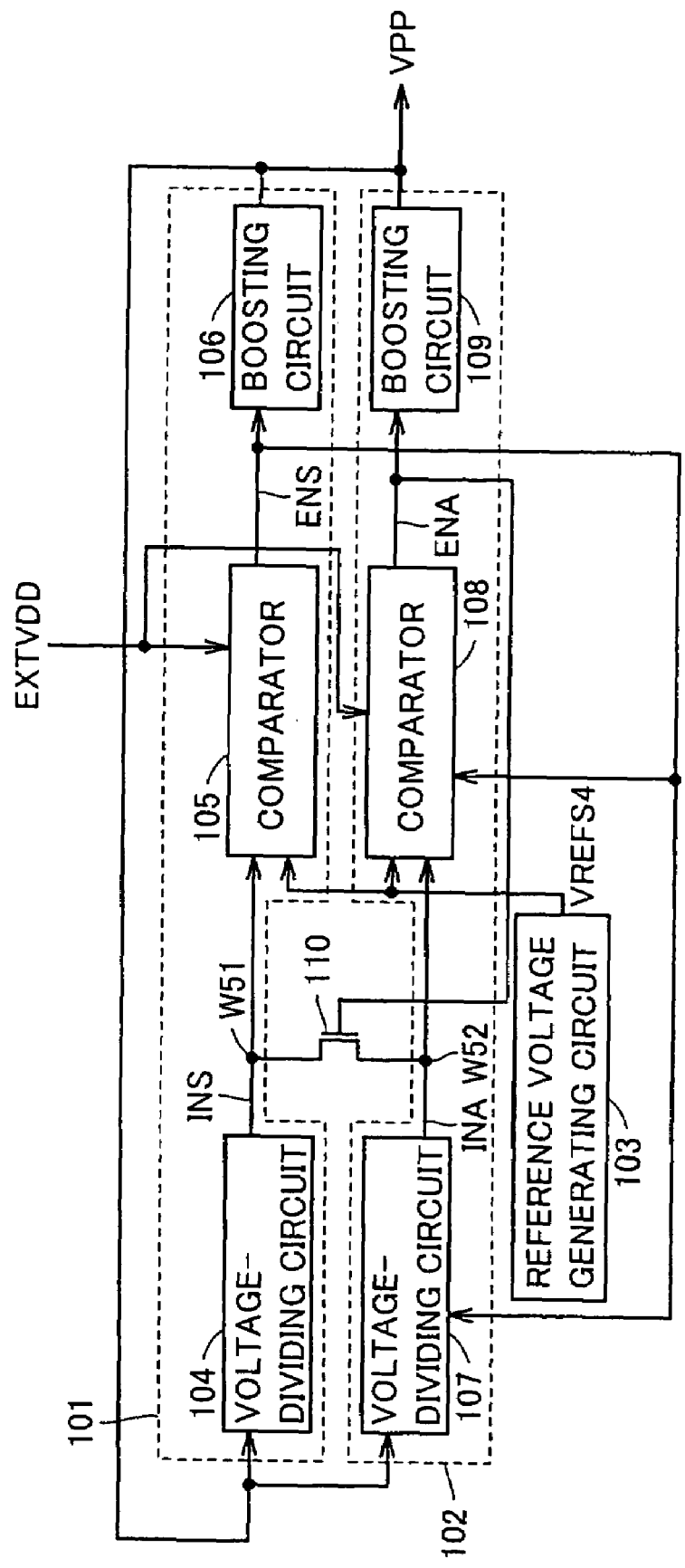
FIG. 17 is a block diagram illustrating the structure of driving power supply circuit 29 illustrated in FIG. 1.

FIG. 17 is a block diagram illustrating the construction of a driving power supply circuit 29 illustrated in FIG. 1.

Potential VPP is applied to the word lines selected in the reading operation and writing operation, and therefore potential fluctuations occur during the reading operation and the writing operation. However, it is necessary that even if fluctuations occur the potential is restored to the set value in a short time. On the other hand, when the reading operation or the writing operation is not performed, namely when the word line selecting operation is not performed, there are little fluctuations in potential VPP and little fluctuation ranges in potential VPP, and therefore potential VPP can be maintained even if the power supply circuit has a relatively small supplying capability. Further, an effective reduction in the current consumption in the power supply circuit for driving this potential VPP leads to reductions in the current consumption in the semiconductor memory device itself. Driving power supply circuit 29 overcomes this challenge.

Referring to FIG. 17, driving power supply circuit 29 includes a power supply circuit portion 101 for constantly monitoring the potential level of potential VPP and driving the potential level of potential VPP such that it is maintained at a set value, and a power supply circuit portion 102 which has a driving capability larger than that of power supply circuit portion 101 and a high sensitivity to fluctuations in potential VPP and drives the potential of potential VPP for restoring it to the set value by aiding power supply circuit portion 101 during the reading operation of semiconductor memory device 2 of FIG. 1.

Driving power supply circuit 29 further includes a reference voltage generating circuit 103 for generating a reference potential VREFS4 which serves as a reference in the operations of power supply circuit portion 101 and power supply circuit portion 102.

Power supply circuit 101 includes a voltage dividing circuit 104 for reducing potential VPP to a proper potential, a comparator 105 for outputting, as a signal ENS, the result of comparison between reference potential VREFS4 and a potential INS output from voltage dividing circuit 104, and a boosting circuit 106 which receives signal ENS and generates potential VPP. This boosting circuit 106 is constituted by, for example, a so-called charge-pump circuit for performing a pumping operation on receiving a specific frequency signal. Boosting circuit 106 performs a pumping operation, on receiving signal ENS.

Power supply circuit 102 includes a voltage dividing circuit 107 for reducing potential VPP to a proper potential, a comparator 108 for outputting, as a signal ENA, the result of comparison between reference potential VREFS4 and a potential INA output from voltage dividing circuit 107, and a boosting circuit 109 which receives signal ENA and generates potential VPP. Voltage dividing circuit 107 and comparator 108 are activated on receiving signal ENA. Further, boosting circuit 109 is constituted by, for example, a so-called charge-pump circuit for performing a pumping operation on receiving a specific frequency signal, similarly to boosting circuit 106. Boosting circuit 109 performs a pumping operation, on receiving signal ENA.

Driving power supply circuit 29 further includes an N-channel MOS transistor 110 which is connected between a node W51 and a node W52 and conducts on receiving signal ENA at its gate.

Driving power supply circuit 29 of FIG. 17 will be described. Power supply circuit 101 is used for monitoring the potential level of potential VPP and maintaining potential VPP, as previously described. For this reason, power supply circuit 101 is constituted for reducing power consumption as much as possible. More specifically, voltage-dividing circuit 104 included in power supply circuit 101 includes resistors having high resistance values as compared with voltage-dividing circuit 107 included in voltage-dividing circuit 102. By utilizing the resistance ratio of the resistors, currents flowing through the voltage-dividing circuit are decreased, thereby reducing the current consumption. Further, boosting circuit 106 included in power supply circuit 101 has a reduced driving capability as compared with boosting circuit 109 included in power supply circuit 102, thereby reducing the current consumption during operations.

On the other hand, power supply circuit 102 is required to have a large driving capability and a high sensitivity to fluctuations in potential VPP. Voltage-dividing circuit 107 is constituted by resistors having lower resistance values than those of voltage-dividing circuit 104, and therefore voltage-dividing circuit 107 causes increased current consumption, but has a higher sensitivity to fluctuations in potential VPP. Boosting circuit 109 has a large driving capability for rapidly restoring potential VPP to the set value.

In power supply circuit portion 101, voltage-dividing circuit 104 reduces potential VPP to potential INS and then comparator 105 compares potential INS with reference potential VREFS4. From the result of the comparison between potential INS and reference potential VREFS4, it is determined whether or not potential VPP is changed from the set value. However, voltage-dividing circuit 104 has a small driving capability, and therefore a time is required for charging the load capacity in the circuits of voltage-dividing circuit 104 to output potential INS corresponding to the voltage-dividing ratio for potential VPP. Namely, power supply circuit 101 can not immediately detect that potential VPP reaches the set value, and tardily detects that.

If there is no N-channel MOS transistor 110, even when power supply circuit 102 detects potential VPP reaching the set value, power supply circuit portion 101 detects potential VPP reaching the set value later than power supply circuit 102. Power supply circuit portion 102 operates until power supply circuit portion 101 detects potential VPP reaching the set value and signal ENS is switched to the H level from the L level. Thus, power supply circuit portion 102 causes unnecessary current consumption therein.

On the contrary, when N-channel MOS transistor 110 is driven by signal ENA, if signal ENA becomes the H level N-channel MOS transistor 110 conducts and thus potential INS and potential INA become equal. Thus, power supply circuit portion 101 and power supply circuit portion 102 detect potential VPP reaching the set value with the same timing. Since the time required for power supply circuit portion 101 to detect that potential VPP reaches the set value is shortened, power supply circuit 101 suppresses rises in potential VPP above the set value, thereby reducing the current consumption.

Further, during other operations than the reading operation or the writing operation, for example, during a refreshing operation, word lines WL are activated. The utilization of driving power supply circuit 29 is not limited to in the reading operation and it is applicable in the writing operation and the refreshing operation. Hereinafter, the operation of driving power supply circuit 29 in the reading operation will be described, for the convenience of description.

Further, driving power supply circuit 29 is not limited to boosting circuits 106, 109. As illustrated in FIG. 1, driving power supply circuit 29 may be used to supply a power supply to other circuits of load circuit 26 in FIG. 1. In this case, the construction of driving power supply circuit 29 may includes, for example, step-down circuits, instead of boosting circuits 106, 109.

Figure 18:
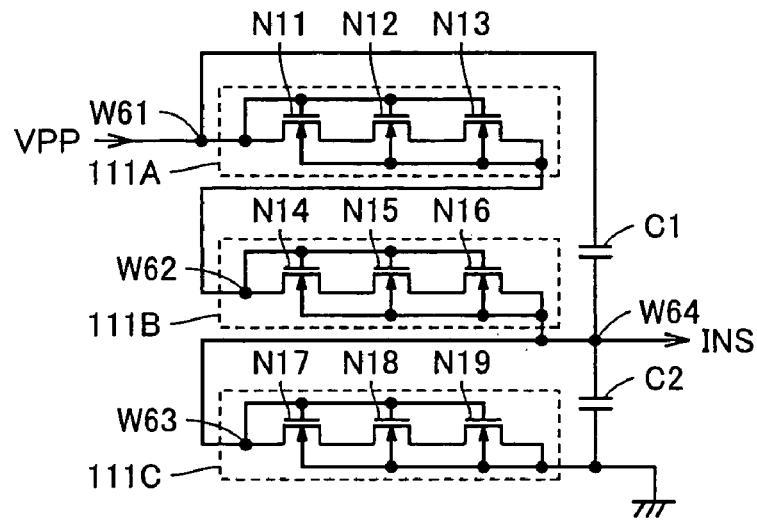
FIG. 18 is a circuit diagram illustrating the structure of voltage-dividing circuit 104 illustrated in FIG. 17.

FIG. 18 is a circuit diagram illustrating the construction of voltage-dividing circuit 104 illustrated in FIG. 17.

Referring to FIG. 18, voltage-dividing circuit 104 includes a voltage-dividing portion 111A connected between a node W61 and a node W62, a voltage-dividing portion 11B connected between node W62 and a node W63, a voltage-dividing portion 111C connected between node W63 and a ground node, a capacitor C1 connected between node W61 and a node W64 and a capacitor C2 connected between node W64 and the ground node.

Voltage-dividing portion 11A includes N-channel MOS transistors N11 to N13 which are diode-connected to form a forward direction from node W61 to node W62.

Voltage-dividing portions 111B, 111C have the same construction as that of voltage-dividing portion 111A. Therefore, description from then on will not be repeated.

Node W64 forms an output node of voltage-dividing circuit 104 and outputs potential INS resulted from the voltage-division of potential VPP.

Figure 19:
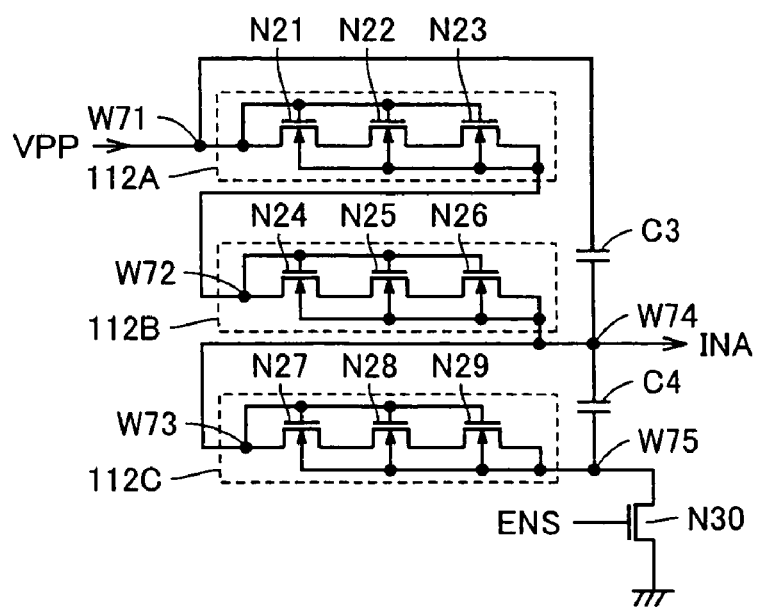
FIG. 19 is a circuit diagram illustrating the structure of voltage-dividing circuit 107 illustrated in FIG. 17.

FIG. 19 is a circuit diagram illustrating the construction of voltage-dividing portion 107 in FIG. 17.

Referring to FIG. 19, voltage-dividing circuit 107 includes a voltage-dividing portion 112A connected between a node W71 and a node W72, a voltage-dividing portion 112B connected between node W72 and a node W73, a voltage-dividing portion 112C connected between node W73 and a node W75, a capacitor C3 connected between node W71 and a node W74 and a capacitor C4 connected between node W74 and node W75.

Voltage-dividing portions 112A to 1112C have the same construction as that of voltage-dividing portion 111A illustrated in FIG. 18. Therefore, description from then on will not be repeated.

Voltage-dividing circuit 107 further includes an N-channel MOS transistor N30 which is connected between node W75 and the ground node and receives signal ENS at its gate.

When N-channel MOS transistor N30 receives signal ENS at the H level at its gate, node W74 outputs potential INS resulted from the voltage-division of potential VPP.

N-channel MOS transistors N21 to N29 of FIG. 19 have a current supplying capability greater than that of N-channel transistors N11 to N19 of FIG. 18. Therefore, when N-channel MOS transistor N30 conducts, potential INA can rapidly follow the change in potential VPP.

Figure 20:
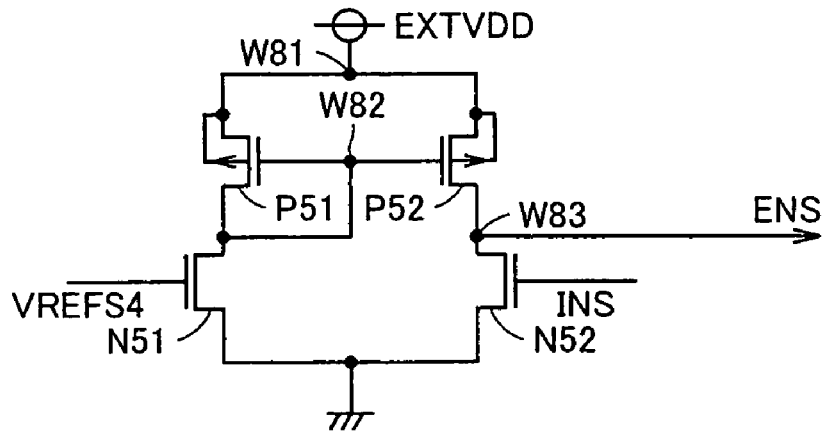
FIG. 20 is a circuit diagram illustrating the structure of comparator 105 illustrated in FIG. 17.

FIG. 20 is a circuit diagram illustrating the construction of comparator 105 of FIG. 17.

Referring to FIG. 20, comparator 105 includes an P-channel MOS transistor P51 connected at its source and back gate to a node W81 which is supplied with external potential EXTVDD and connected at its gate and drain to a node W82, an N-channel MOS transistor N51 which is connected between node W82 and a ground node and receives a reference potential VREFS4 at its gate, an P-channel MOS transistor P52 connected at its souse and back gate to node W81, connected at its gate to node W82 and connected at its drain to node W83, and an N-channel MOS transistor N52 which is connected between node W83 and the ground node and receives potential INS at its gate. Node W83 forms an output node of comparator 105 and outputs signal ENS.

Figure 21:
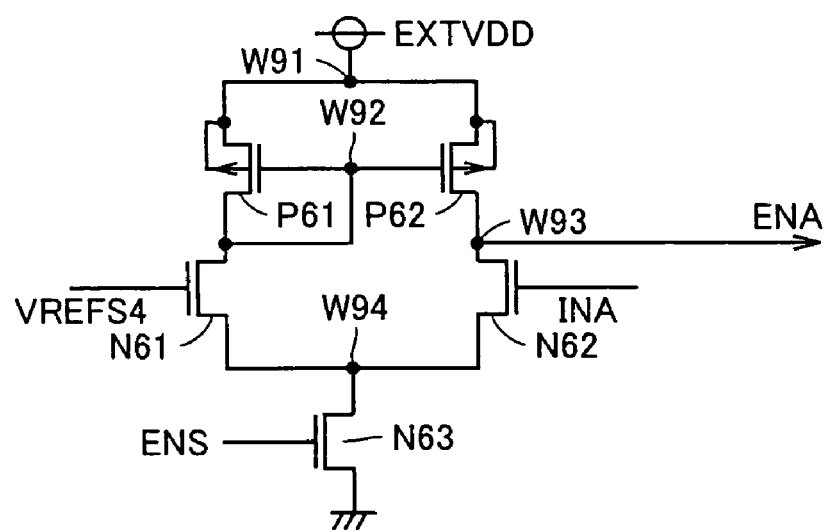
FIG. 21 is a circuit diagram illustrating the structure of comparator 108 illustrated in FIG. 17.

FIG. 21 is a circuit diagram illustrating the construction of comparator 108 of FIG. 17.

Referring to FIG. 21, comparator 108 includes an P-channel MOS transistor P61 connected at its source and back gate to a node W91 which is supplied with external potential EXTVDD and connected at its gate and drain to a node W92, an N-channel MOS transistor N61 which is connected between a node W92 and a node W94 and receives reference potential VREFS4 at its gate, an P-channel MOS transistor P62 connected at its souse and back gate to node W91, connected at its gate to node W92 and connected at its drain to node W93, an N-channel MOS transistor N62 which is connected between node W93 and node W94 and receives potential INA at its gate, and an N-channel MOS transistor N63 which is connected between node W93 and node W94 and receives signal ENS at its gate. Node W93 forms an output node of comparator 108 and outputs signal ENA.

The construction of comparator 108 of FIG. 21 is different from that of comparator 105 of FIG. 20 in that it includes N-channel MOS transistor N63. Comparator 105 of FIG. 20, when fed with external potential EXTVDD, constantly compares potential INS with reference potential VREFS4 and if potential INS decreases below reference potential VREFS4, comparator 105 outputs signal ENS at the H level. On the other hand, comparator 108 of FIG. 21, when signal ENS becomes the H level, compares potential INA with reference potential VREFS4 and when potential INA decreases below reference potential VREFS4, comparator 108 outputs signal ENA at the H level.

Figure 22:
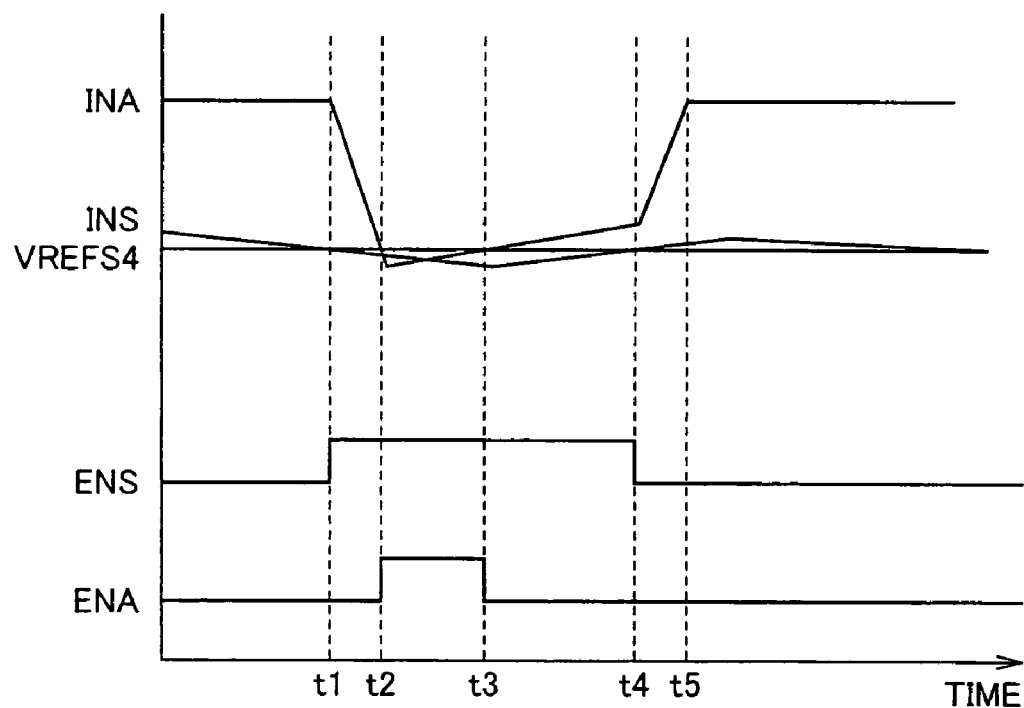
FIG. 22 is a view illustrating a case where potential INS and potential INA individually change.

FIG. 22 is a view illustrating a case where potential INA and potential INS individually change. The case where potential INS and potential INA individually change refers to the case where driving power supply circuit 29 of FIG. 17 does not include N-channel MOS transistor 110.

Referring to FIG. 22, before the time t1, current consumption occurs due to the row selecting operation, namely the word line selecting operation, and thus potential VPP decreases.

Then, at the time t1, potential INS decreases below reference potential VREFS4, and signal ENS rises to the H level. On receiving the signal ENS at the H level, voltage-dividing circuit 107 and comparator 108 illustrated in FIG. 17 are activated. Potential INA is changed to a potential resulted from the voltage-division of potential VPP.

Further, when signal ENS becomes the H level is not limited to when potential INS decreases below reference potential VREFS4. For example, signal ENS may become the H level in response to a CE (Chip Enable) signal, which is not shown, being input to semiconductor memory device 2 of FIG. 1 from outside.

Then, at the time t2, potential INA decreases below reference potential VREFS4 and thus signal ENA rises to the H level. On receiving the signal ENS at the H level, boosting circuit 109 illustrated in FIG. 17 is activated to raise potential VPP.

Further, in voltage-dividing circuit 107 of FIG. 18, discharging of capacitors C1 and C2 due to currents flowing through, for example, N-channel MOS transistors N17 to N19 exceeds charging of capacitors C1 and C2 due to the rise of VPP. Therefore, potential INS continues to decrease after the time t2, regardless of rises of potential VPP.

Then, at the time t3, potential INA rises to reference potential VREFS4. Signal ENA becomes the L level and boosting circuit in FIG. 17 terminates raising the voltage.

On the other hand, since potential INS continues to decrease due to the discharging of the capacitors, signal ENS is maintained at the H level. Potential VPP is further raised by boosting circuit 106 of FIG. 17 and when charging of capacitors C1 and C2 exceeds the discharging of capacitors C1 and C2, potential INS changes from decreasing to increasing.

Then, at the time t4, potential INS reaches reference potential VREFS4, and signal ENS becomes the L level. Boosting circuit 106 terminates raising potential VPP. Further, signal ENS becomes the L level, and therefore voltage-dividing circuit 107 and comparator 108 of FIG. 17 stop.

Then, at the time t5, potential INA becomes potential VPP. On the other hand, the operation speed of voltage-dividing circuit 104 is low and therefore potential INS rises even after the time t5. After the time t5, potential VPP decreases due to current consumption caused by discharge from parasitic capacitance in the word lines, and then potential INS decreases tardily.

Figure 23:
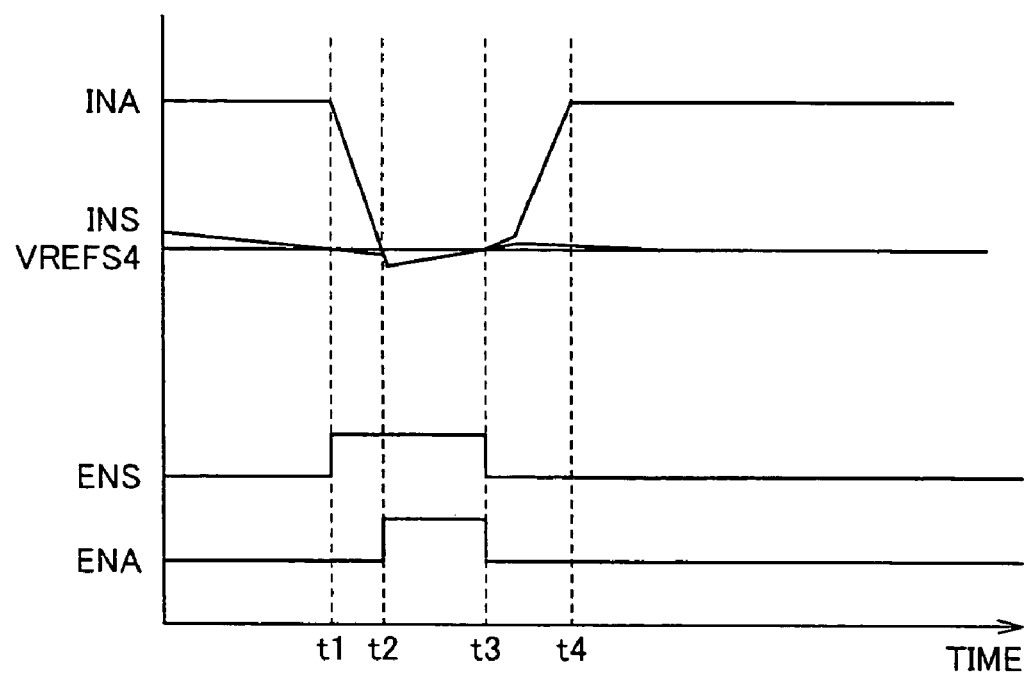
FIG. 23 is a view illustrating the changes of potential INS and potential INA in driving power supply circuit 29.

FIG. 23 is a view illustrating the changes of potential INS and potential INA in driving power supply circuit 29.

Referring to FIG. 23, the changes of potential INA and potential INS at the times t1 to t2 are the same as the changes of potential INA and potential INS at the times t1 to t2 in FIG. 22. Therefore, description from then on will not be repeated.

At the time t2, signal ENA becomes the H level, and thus N-channel MOS transistor 110 conducts, thereby equalizing potential INS and potential INA. With potential VPP is increased by boosting circuits 106, 109, potentials INS, INA are equally increased.

Then, at the time t3, potentials INS, INA both reach reference potential VREFS4. Signals ENS, ENA both become the L level. Boosting circuits 106, 109 terminates raising potential VPP. Further, N-channel MOS transistor 110 is brought into the non-conducting state.

Then, at the time t4, potential INA becomes potential VPP. Potential INS increases at the time t3 to the time t4 and from then on decreases with VPP decreases due to current consumption.

Figure 24:
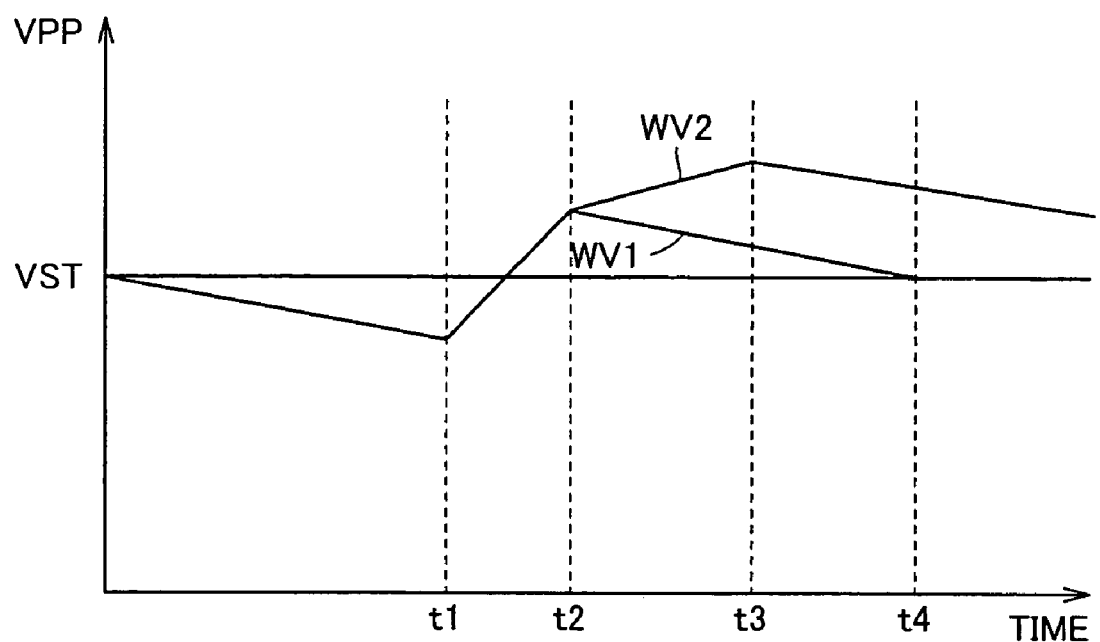
FIG. 24 is a view illustrating fluctuations in potential VPP depending on the presence or absence of the conduction of N-channel MOS transistor 110.

FIG. 24 is a view illustrating the change of potential VPP depending on the presence or absence of N-channel MOS transistor 110 illustrated in FIG. 17, namely the presence or absence of the conduction of N-channel MOS transistor 110.

Referring to FIG. 24, first, before the time t1, potential VPP decreases below the set value VST due to current consumption.

At the time t1, boosting circuit 109 illustrated in FIG. 17 starts to operate. Potential VPP is raised by boosting circuits 106, 109.

Then, at the time t2, signal ENA which is not shown becomes the L level. If N-channel MOS transistor 110 of FIG. 17 conducts at the time t1 to the time t2, boosting circuits 106, 109 stops concurrently at the time t2. Therefore, after the time t2, potential VPP decreases as illustrated by a waveform WV1.

On the other hand, when N-channel MOS transistor 110 does not exist (conducts) at the time t1 to the time t2, even if boosting circuit 109 stops after the time t2, boosting circuit 106 continues to operate. Therefore, after the time t2, potential VPP further increases as illustrated by a waveform WV2.

Then, at the time t3, boosting circuit 106 steps and from then on potential VPP decreases due to current consumption.

As illustrated in FIG. 24, waveform WV1 has small potential fluctuations relative to the set value VST, as compared with waveform WV2. Namely, with driving power supply circuit 29 of FIG. 17, N-channel MOS transistor 110 is operated at the time t1 to the time t2 to suppress fluctuations in potential VPP, thereby suppressing increases in unnecessary current consumption and also ensuring the reliability of the device.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A semiconductor memory device comprising:
   a load circuit; and
   a power supply circuit supplying a power supply potential to said load circuit, wherein
   said power supply circuit includes
   a first driving circuit determining whether or not said power supply potential is a predetermined potential and adjusting said power supply potential to said predetermined potential,
   a second driving circuit activated according to the result of the determination of said first driving circuit, determining whether or not said power supply potential is a predetermined potential and adjusting said power supply potential to said predetermined potential, and
   an equalizing portion equalizing the result of the determination of said first driving circuit and the result of the determination of said second driving circuit when said second driving circuit completes the operation.

2. The semiconductor memory device according to claim 1, wherein
   said load circuit includes
   a plurality of memory cells arranged in rows and columns, and a plurality of word lines arranged in correspondence with said rows, and said first and said second driving circuits supply, as said power supply potential, a driving potential to be applied to selected word lines among said plurality of word lines.

3. The semiconductor memory device according to claim 2, wherein said first driving circuit includes a first voltage-dividing circuit outputting a first potential generated by voltage-dividing said driving potential, a first comparator outputting a first comparison result of comparison between said first potential and a reference potential, and a first boosting circuit activated according to said first comparison result and generating said driving potential to be applied to word lines, said second driving circuit includes a second voltage-dividing circuit activated according to said first comparison result and outputting a second potential generated by voltage-dividing said driving potential, a second comparator activated according to said first comparison result and outputting a second comparison result of comparison between said second potential and a reference potential, and a second boosting circuit activated according to said second comparison result and generating said driving potential to be applied to word lines, and said equalizing portion includes a short-circuiting portion activated according to said second comparison result and short-circuiting between said first potential and said second potential.

* * * * *